US012803571B2

(12) United States Patent
Jung et al.

(10) Patent No.: US 12,803,571 B2
(45) Date of Patent: Nov. 17, 2026

(54) PRESETTABLE RAMP DRIVER TO DRIVE ADC FOR IMAGE SENSOR

(71) Applicant: OmniVision Technologies, Inc., Santa Clara, CA (US)

(72) Inventors: Hyunyong Jung, San Jose, CA (US); Hiroaki Ebihara, San Jose, CA (US); Nobuhiro Yanagisawa, San Jose, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 37 days.

(21) Appl. No.: 19/033,636

(22) Filed: Jan. 22, 2025

(65) Prior Publication Data

US 2026/0058668 A1 Feb. 26, 2026

Related U.S. Application Data

(60) Provisional application No. 63/686,960, filed on Aug. 26, 2024.

(51) Int. Cl.
*H03M 1/12* (2006.01)
*H03M 1/34* (2006.01)
*H04N 25/78* (2023.01)

(52) U.S. Cl.
CPC ........... *H03M 1/1245* (2013.01); *H03M 1/34* (2013.01); *H04N 25/78* (2023.01)

(58) Field of Classification Search
CPC ...... H03M 1/1245; H03M 1/34; H03M 1/123; H03M 1/56; H04N 25/78; H04N 25/616; H04N 25/618
See application file for complete search history.

(56) References Cited

U.S. PATENT DOCUMENTS 6,288,666 B1 * 9/2001 Afghahi ............... H03K 5/2481 341/158
2016/0011899 A1 1/2016 Machida
2016/0118992 A1 4/2016 Milkov
2018/0219037 A1 * 8/2018 Nakamura .......... H10F 39/8023
2018/0278875 A1 * 9/2018 Rotte .................. H04N 25/778
2020/0266785 A1 * 8/2020 Jung ......................... H03F 3/68
2022/0321812 A1 * 10/2022 Kobayashi ........... H04N 25/627
2024/0430598 A1 * 12/2024 Cho ........................ H03M 1/56
2025/0113120 A1 * 4/2025 An ......................... H04N 25/78

* cited by examiner

*Primary Examiner* — Jason A Flohre
(74) *Attorney, Agent, or Firm* — Christensen O'Connor Johnson Kindness PLLC

(57) ABSTRACT

An analog-to-digital converter (ADC) converts analog image signal received from a bitline to a digital signal through an ADC comparator. The ADC comparator compares an image signal voltage at its first input against a ramp voltage at its second input to trigger a latch and to cause a digital signal output from the ADC. Each pixel voltage is coupled to only one comparator at its first input through a sample capacitor. A ramp generator generates a global ramp voltage as an input to a plurality of presettable ramp drivers. Each presettable ramp driver outputs a buffered ramp voltage to drive multiple ADC comparators simultaneously at their second inputs. Model circuits of the presettable ramp drivers are disclosed, and respective procedures of presetting the presettable ramp drivers are presented to demonstrate how each of featured presettable ramp drivers is conditioned to drive multiple ADC comparators of the ADCs.

26 Claims, 16 Drawing Sheets

PRESETTABLE RAMP DRIVER TO DRIVE ADC FOR IMAGE SENSOR

CROSS-REFERENCE TO RELATED APPLICATION

The present application claims the benefit of U.S. Provisional Patent Application Ser. No. 63/686,960, filed Aug. 26, 2024, which is incorporated by reference herein in its entirety.

TECHNICAL FIELD

This disclosure relates generally to image sensors, and in particular but not exclusively, relates to analog to digital conversion (ADC) circuitry for use in reading out image data from an image sensor.

BACKGROUND INFORMATION

Image sensors have become ubiquitous. They are widely used in digital still cameras, cellular phones, security cameras, as well as, medical, automobile, and other applications. Image sensors commonly utilize Complementary-Metal-Oxide-Semiconductor (CMOS) image sensors to capture image data of an imaged scene. CMOS devices include an array of pixels which are photosensitive to incident light from a scene for a particular amount of time. This exposure time allows charges of individual pixels to accumulate until the pixels have a particular signal voltage value, also known as the pixel grey value. These individual signal voltage values may then be correlated into digital image data representing the imaged scene.

Image quality is very important. To achieve higher quality, the increase of the number of pixels within the array provides one solution. To eliminate as much noise in the image data as possible provides the other. A common way in CMOS image sensors to reduce noise is correlated double sampling (CDS). CDS reduces the noise in the signal by calculating the difference between the signal voltage value (image grey value), and a reset signal (image black background noise, also called dark current noise) for the given pixel. Implementing CDS reduces the fixed pattern noise and other temporal noise from the image data. Correlated double sampling may be done in analog or digital domain.

A system for digital correlated double sampling for an image sensor having a plurality of pixels includes: an analog-to-digital convertor (ADC) stage for converting analog data into digital image data and outputting reset data; memory for storing both the digital image data and the reset data; and a digital correlated double sampling (DCDS) stage for generating digitally correlated double sampled image data based upon the subtraction between the digital image data and the digital reset data.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
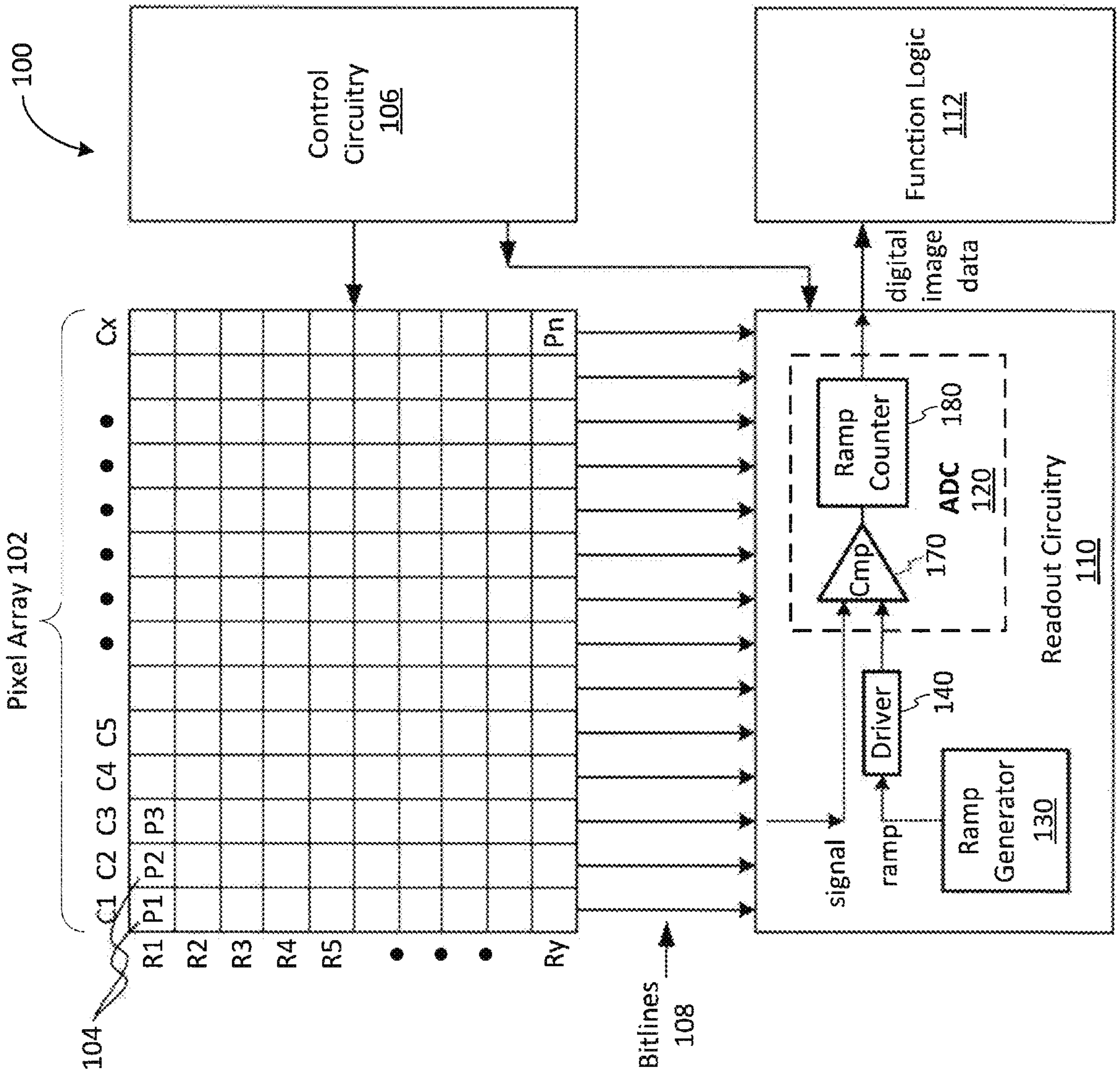
FIG. 1 illustrates one example of an imaging system in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples directed to a readout analog to digital converter (ADC) circuitry with presettable ramp driver are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 106, column arranged readout bitlines 108, readout circuitry 110, and function logic 112. In one example, pixel array 102 is a two-dimensional (2D) array of photodiodes, or image sensor pixel cells 104 (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image data or image charge, the image data is readout by readout circuitry 110 and then transferred to function logic 112. The readout circuitry 110 may be coupled to read out image data from the plurality of photodiodes in pixel array 102 through bitlines 108. As will be described in greater detail below, the readout circuitry 110 comprises a ramp generator 130, a plurality of presettable ramp drivers 140, and a plurality of ADCs 120, wherein each ADC 120 comprises an ADC comparator 170 and a ramp counter 180. In various examples, the readout circuitry 110 may also include amplification circuitry.

In one example, function logic 112 may simply store the image data or even manipulate the image data by applying post image effects (e.g., crop, rotate, remove red eye, adjust brightness, adjust contrast, or otherwise). In one example, readout circuitry 110 may readout a row of image data at a time along readout column lines (illustrated) or may read the image data out using a variety of other techniques (not illustrated), such as a serial readout or a full parallel readout of all pixels 104 simultaneously.

In one example, imaging system 100 may be included in a digital camera, cell phone, laptop computer, security system, automobile, or the like. Additionally, imaging system 100 may be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware may deliver instructions to imaging system 100, extract image data from imaging system 100, or manipulate image data supplied by imaging system 100. Control circuitry 106 may also provide control signals to control or condition the readout circuitry 110.

Figure 2:
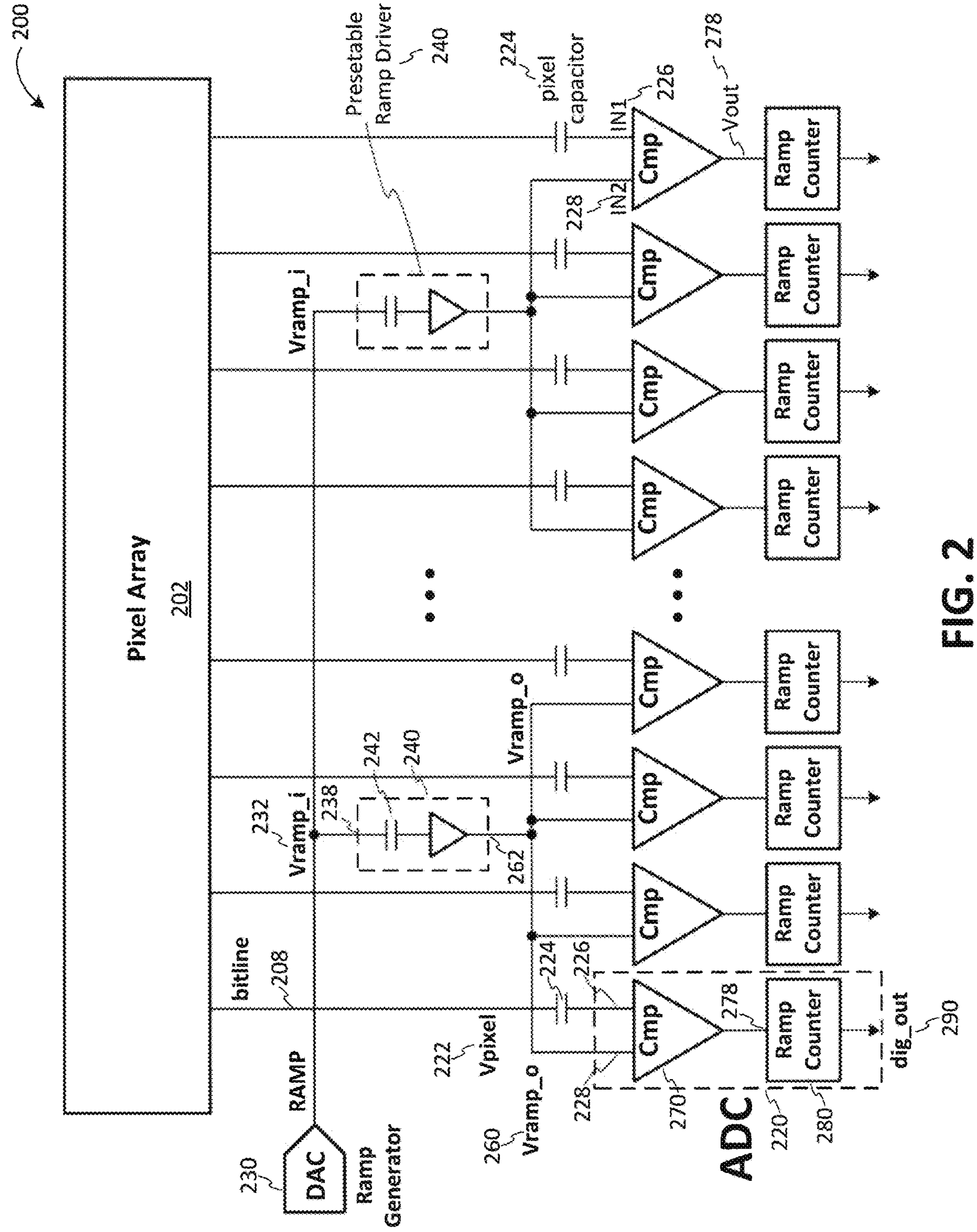
FIG. 2 is a schematic that shows one example of a readout ADC circuit including example presettable ramp drivers to drive a few ADC comparators and pixel capacitors coupled to each associated ADC comparator in accordance with the teaching of the present disclosure.

FIG. 2 is a schematic example of a readout ADC circuit 220 that comprises an ADC comparator 270 and a ramp counter 280 in accordance with the teaching of the present disclosure. The readout ADC circuit 220 is one example circuit of ADC 120 as included, for instance, in readout circuitry 110 of FIG. 1. The readout ADC circuitry 220 converts an analog input voltage Vpixel 222 to a digital output code dig_out 290 of N bits at the ADC output, where N is an integer.

The analog image voltage signal Vpixel 222 comes from the readout bitline 208. A bias current source (not shown) is coupled to the bitline 208 which provides bias current to a column of pixels 104 through the bitline 208. The analog signal Vpixel 222 is coupled to a first input terminal IN1 226 of the ADC comparator 270 through a coupling pixel capacitor C_pxl 224, where the C_pxl 224 may be the only component coupled immediately between the bitine 208 and the In1 226 of the ADC comparator 270.

A ramp generator 230 outputs a ramp input voltage Vramp_i 232 fanned out globally. The ramp input voltage Vramp_i 232 is coupled to an input 238 of a presettable ramp driver 240. The presettable ramp driver 240 provides a ramp output voltage Vramp_o 260 at its output 262. Each of the ramp output voltage Vramp_o 260 of an individual presettable ramp driver 240 drives at least two readout ADC circuitry 220 (shown as driving 4 ADCs) in FIG. 2.

A second input terminal IN2 228 of the ADC comparator 270 receives the ramp output voltage Vramp_o 260 from a respective presettable ramp driver 240. The ADC comparator 270 compares the signal voltage at IN1 226 with the variable voltage at IN2 228, and flips its output voltage Vout 278 when the voltage at IN2 228 matches that of the IN1 226. Vout 278 triggers the latch of the ramp counter 280. The latched digital signal dig_out 290 may be read and transmitted to the Function Logic 112 for storage and processing.

Since a paired dig_out signals, the digital image data and the reset data acquired close enough to each other in time and under the same circuit setting condition may be stored in a memory of the Function Logic 112, a digital correlated double sampling (DCDS) operation for generating digitally correlated double sampled image data based upon the subtraction between the digital image data and the digital reset data may be performed.

Figure 3A:
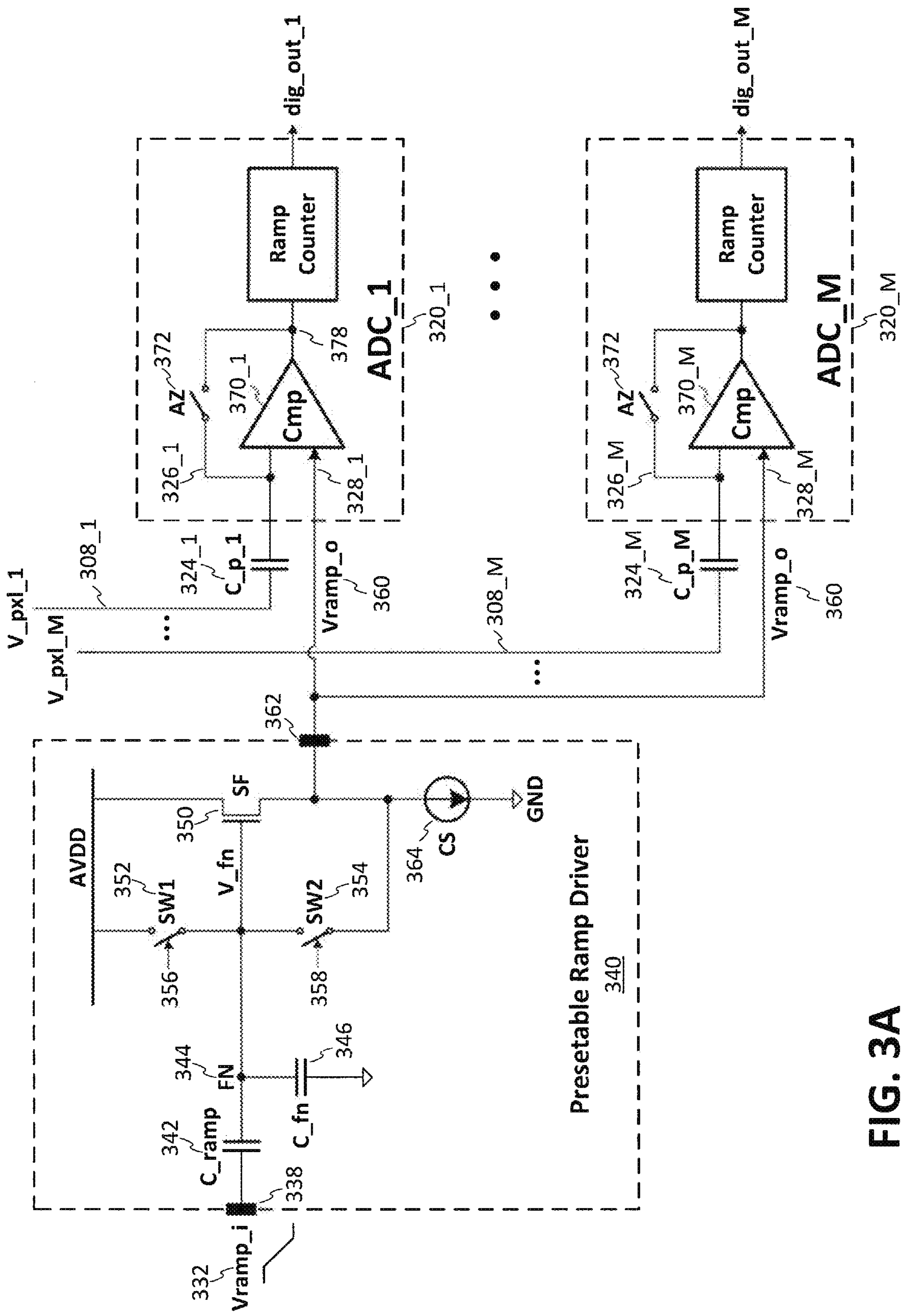
FIG. 3A is a schematic that shows a first embodiment of example presettable ramp drivers driving multiple associated ADC comparators in accordance with the teaching of the present disclosure.

FIG. 3A is a schematic that shows a first embodiment of an example presettable ramp driver 340 driving at least two associated ADC comparators 370 of ADC_1 320_1 through ADC_M 320_M, where M is an integer equal or larger than 2, in accordance with the teaching of the present disclosure. For each presettable ramp drivers 340, a ramp capacitor 342 is coupled between a driver input 338 of the presettable ramp driver 340 and a floating node (FN) 344. The driver input 338 is driven by a ramping down Vramp_i 332 from a ramp generator 230 (no shown). The FN 344 has an intrinsic capacitance of C_fn 346 and is coupled to a gate of a source follower (SF) transistor 350 made of an n-channel metal-oxide semiconductor (NMOS) transistor. A drain terminal of the SF transistor 350 is coupled to a power supply AVDD. A source terminal of the SF transistor 350 is coupled to a driver output 362 of the presettable ramp driver 340. A current source 364 is coupled between the driver output 362 and a ground (GND). The driver output 362 is coupled to a second input 328 of each M ADC comparators 370 of a plurality ADC comparators 370.

Also for each presettable ramp drivers 340, a first switch (SW1) 352 is coupled between the power supply and the FN 344. A second switch (SW2) 354 is coupled between the FN 344 and the driver output 362. The first switch SW1 352 may be made of an n-channel metal-oxide semiconductor (NMOS) transistor or a p-channel metal-oxide semiconductor (PMOS) transistor with a gate terminal controlled by a first switch control signal 356. The second switch SW2 354 may be made of an NMOS transistor with its gate terminal controlled by a second switch control signal 358.

Also showed in FIG. 3A, a pixel voltage V_pxl_1 on bitline 308_1 is coupled to a first input 326_1 of the ADC comparator 370_1 of ADC 320_1 through a pixel capacitor C_p_1 324_1. And a pixel voltage V_pxl_M on bitline 308_M is coupled to a first input 326_M of the ADC comparator 370_M of ADC 320_M through a pixel capacitor C_p_M 324_M. An auto-zero (AZ) switch 372 is coupled between the first input 326 and an output 378 of the ADC comparator 370 of the plurality of ADC comparators 370. The AZ switch 372 turns ON and OFF for a short duration pT to reset the ADC comparator 370 for a refreshed operation of ADC 320 from its previous operation. All AZ switches 372 of all ADCs 320 are control by the same AZ switch control signal issued by the control circuitry 106.

Figure 3B:
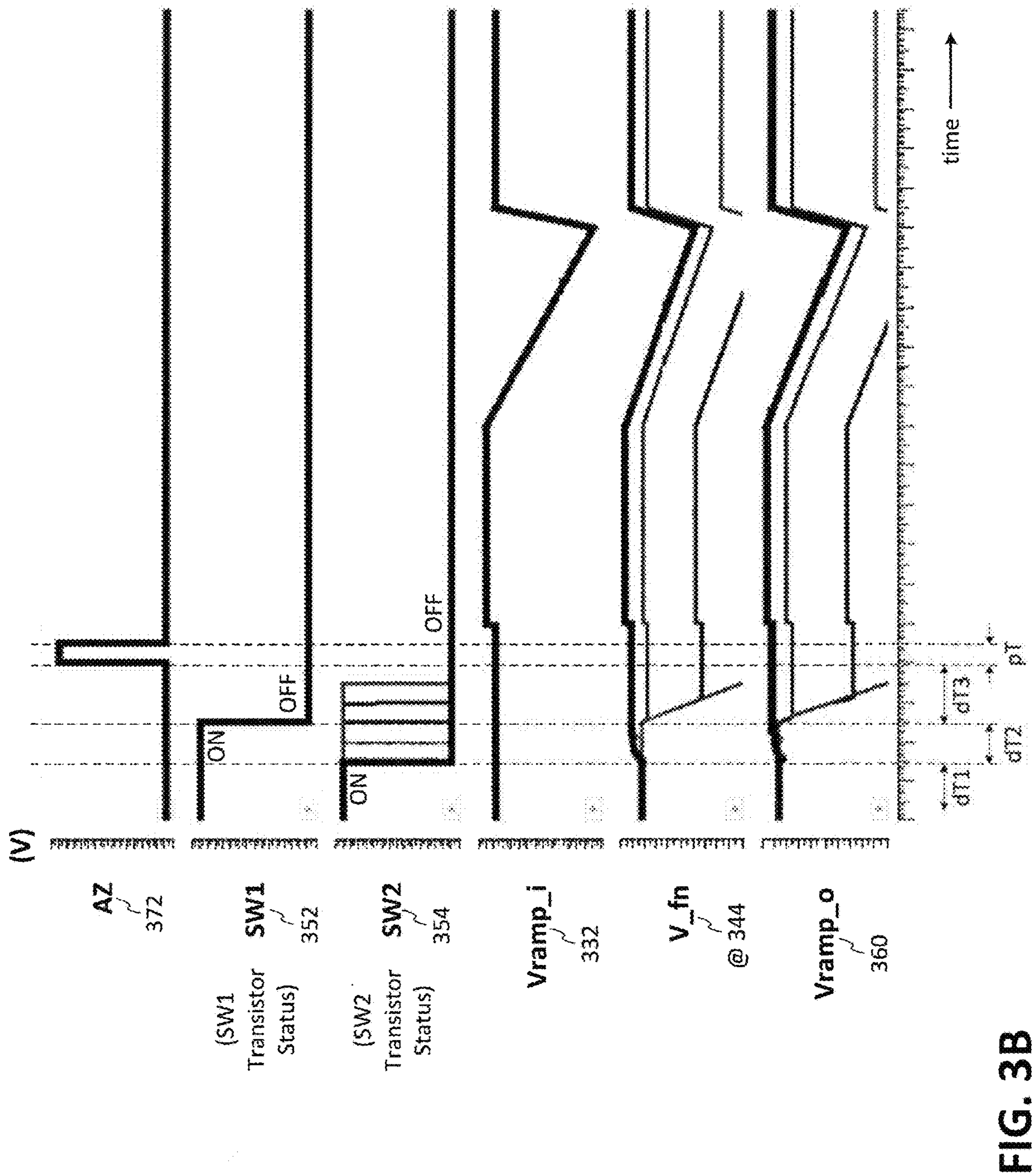
FIG. 3B is a schematic that demonstrates a procedure of presetting the example presettable ramp driver shown in FIG. 3A to prepare the ADCs for their operations in accordance with the teaching of the present disclosure.

FIG. 3B is a schematic that demonstrates a procedure of presetting the example presettable ramp driver 340 shown in FIG. 3A to prepare the M ADCs 320, driven by the driver output 362 at second inputs of the M ADCs 320, for their operations in accordance with the teaching of the present disclosure. In a sequence, a presetting procedure may include the following steps: (a) setting both SW1 352 by the first switch control signal 356 and SW2 354 by the second switch control signal 358 ON for a first time duration dT1, as shown in FIG. 3B; (b) flipping the second switch control signal 358 to turn SW2 354 OFF for a second time duration dT2; (c) flipping the first switch control signal 356 to turn SW1 352 OFF for a third time duration dT3; (d) generating a voltage pulse with a width of a fourth time duration pT to turn the auto-zero (AZ) switch 372 ON and OFF to reset the ADC comparator 370 of ADC 320.

As can be seen from FIG. 3B, after dT3, the presettable ramp driver 340 is preset and is ready to drive the ADC 320. And after the AZ reset upon the conclusion of the pT, the ADC 320 is ready to operate normally. As indicated by all the waveform curves, a ramp voltage Vramp_o 360 at the driver output 362 follows a ramp voltage Vramp_i 332 at the driver input 338 very well, as demanded by the design, through the floating node voltage V_fn at the FN 344.

The time durations dT1, dT2, dT3, and pT shown in FIG. 3B are in the range of a few picoseconds to a few microseconds. The first switch control signal 356 and the second switch control signal 358 are provided by the control circuitry 106.

Figure 3C:
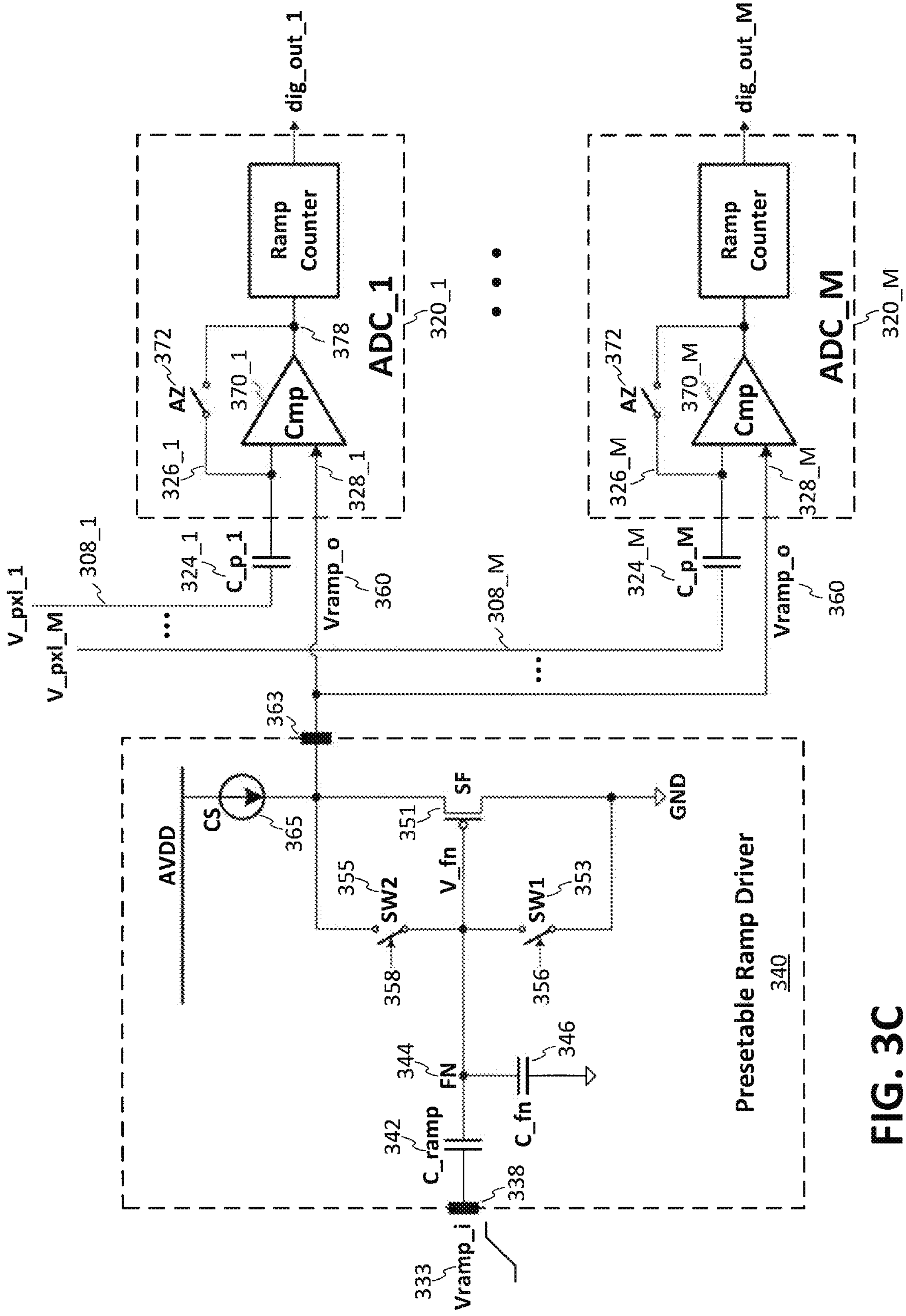
FIG. 3C is a schematic that shows a second embodiment of example presettable ramp drivers driving multiple associated ADC comparators in accordance with the teaching of the present disclosure.

FIG. 3C is a schematic that shows a second embodiment of an example presettable ramp driver 340 driving multiple associated ADC comparators 370 of ADC_1 320_1 through ADC_M 320_M, where M is an integer equal or larger than 2, in accordance with the teaching of the present disclosure.

For each presettable ramp drivers 340, a ramp capacitor 342 is coupled between a driver input 338 of the presettable ramp driver 340 and a floating node (FN) 344. The driver input 338 is driven by a ramping up Vramp_i 333 from the ramp generator 230 (no shown). The FN 344 has an intrinsic capacitance of C_fn 346 and is coupled to a gate of a source follower (SF) transistor 351 made of a p-channel metal-oxide semiconductor (PMOS) transistor. A drain terminal of the SF transistor 351 is coupled to a ground (GND). A source terminal of the SF transistor 351 is coupled to a driver output 363 of the presettable ramp driver 340. A current source 365 is coupled between the driver output 363 and a power supply (AVDD). The driver output 363 is coupled to a second input 328 of each M ADC comparators 370 of a plurality ADC comparators 370.

Also for each presettable ramp drivers 340, a first switch (SW1) 353 is coupled between the FN 344 and the GND. A second switch (SW2) 355 is coupled between the FN 344 and the driver output 363. The first switch SW1 353 may be made of an n-channel metal-oxide semiconductor (NMOS) transistor or a PMOS transistor with a gate terminal controlled by the first switch control signal 356. The second switch SW2 355 may be made of an NMOS transistor or a PMOS transistor with its gate terminal controlled by the second switch control signal 358.

Also showed in FIG. 3C, a pixel voltage V_pxl_1 on bitline 308_1 is coupled to a first input 326_1 of the ADC comparator 370_1 of ADC 320_1 through a pixel capacitor C_p_1 324_1. And a pixel voltage V_pxl_M on bitline 308_M is coupled to a first input 326_M of the ADC comparator 370_M of ADC 320_M through a pixel capacitor C_p_M 324_M. An auto-zero (AZ) switch 372 is coupled between the first input 326 and an output 378 of the ADC comparator 370 of the plurality of ADC comparators 370. The AZ switch 372 turns ON and OFF for a short duration pT to reset the ADC comparator 370 for a refreshed operation of ADC 320 from its previous operation. All AZ switches 372 of all ADCs 320 are control by the same AZ switch control signal issued by the control circuitry 106.

Figure 3D:
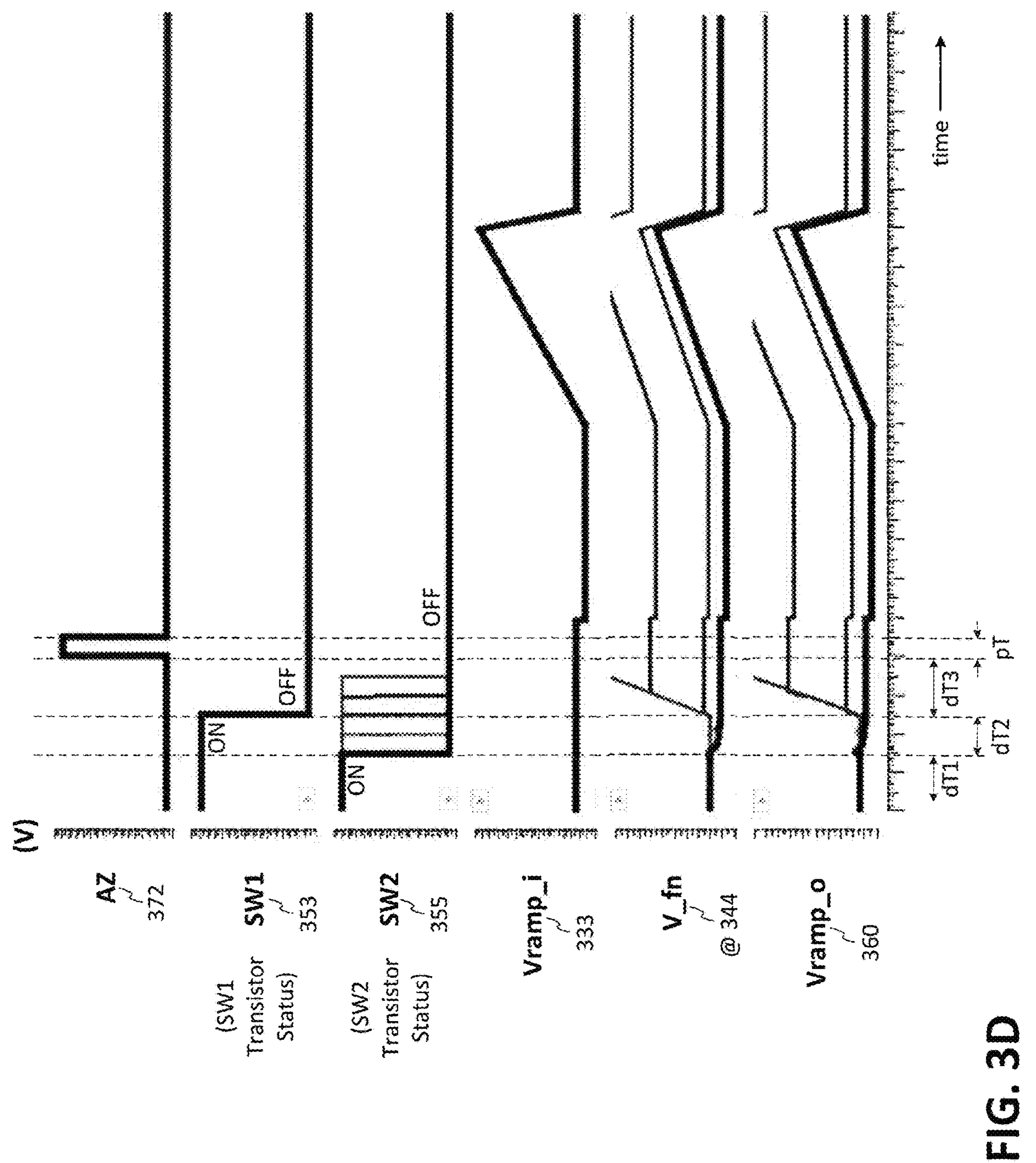
FIG. 3D is a schematic that demonstrates a procedure of presetting the example presettable ramp driver shown in FIG. 3C to prepare the ADCs for their operations in accordance with the teaching of the present disclosure.

FIG. 3D is a schematic that demonstrates a procedure of presetting the example presettable ramp driver 340 shown in FIG. 3C to prepare the M ADCs 320, driven by the driver output 363 at second inputs of the M ADCs 320, for their operations in accordance with the teaching of the present disclosure. In a sequence, a presetting procedure may include the following steps: (a) setting both SW1 353 by the first switch control signal 356 and SW2 355 by the second switch control signal 358 ON for a first time duration dT1, as shown in FIG. 3D; (b) flipping the second switch control signal 358 to turn SW2 355 OFF for a second time duration dT2; (c) flipping the first switch control signal 356 to turn SW1 353 OFF for a third time duration dT3; (d) generating a voltage pulse with a width of a fourth time duration pT to turn the auto-zero (AZ) switch 372 ON and OFF to reset the ADC comparator 370 of ADC 320.

As can be seen from FIG. 3D, after dT3, the presettable ramp driver 340 is preset and is ready to drive the ADC 320. And after the AZ reset upon the conclusion of the pT, the ADC 320 is ready to operate normally. As indicated by all the waveform curves, a ramp voltage Vramp_o 360 at the driver output 363 follows a ramp voltage Vramp_i 333 at the driver input 338 very well, as demanded by the design, through the floating node voltage V_fn at the FN 344.

The time durations dT1, dT2, dT3, and pT shown in FIG. 3D are in the range of a few picoseconds to a few microseconds. The first switch control signal 356 and the second switch control signal 358 are provided by the control circuitry 106.

Figure 4A:
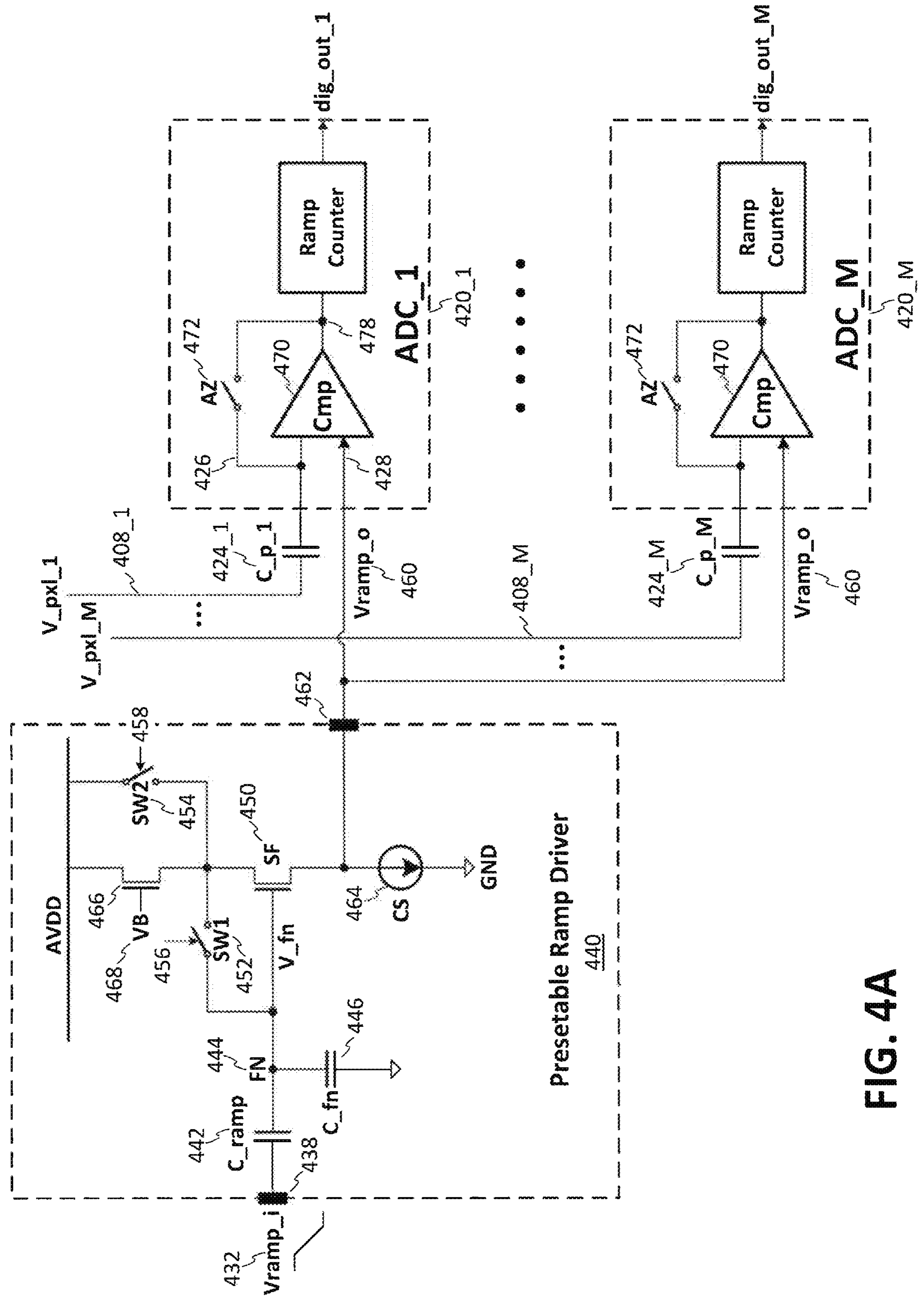
FIG. 4A is a schematic that shows a third embodiment of example presettable ramp drivers driving multiple associated ADC comparators in accordance with the teaching of the present disclosure.

FIG. 4A is a schematic that shows a third embodiment of an example presettable ramp driver 440 driving at least two associated ADC comparators 470 of ADC_1 420_1 through ADC_M 420_M, where M is an integer equal or larger than 2, in accordance with the teaching of the present disclosure. For each presettable ramp drivers 440, a ramp capacitor 442 is coupled between a driver input 438 of the presettable ramp driver 440 and a floating node (FN) 444. The driver input 438 is driven by a ramp voltage Vramp_i 432 from the ramp generator 230 (no shown). The FN 444 has an intrinsic capacitance of C_fn 446 and is coupled to a gate of a source follower (SF) transistor 450 made of an n-channel metal-oxide semiconductor (NMOS) transistor. A drain terminal of the SF transistor 450 is coupled to a power supply AVDD. A source terminal of the SF transistor 450 is coupled to a driver output 462 of the presettable ramp driver 440. A current source 464 is coupled between the driver output 462 and a ground (GND). The driver output 462 is coupled to a second input 428 of each M ADC comparators 470_1 through 470_M of a plurality ADC comparators 470.

Also for each presettable ramp drivers 440, a first switch (SW1) 452 is coupled between the FN 444 and the drain terminal of the SF transistor 450. A second switch (SW2) 454 is coupled between the drain terminal of the SF transistor 450 and the power supply. A bias transistor 466 also is coupled between the drain terminal of the SF transistor 450 and the power supply. The bias transistor 466 is controlled by a bias voltage 468 for its optimal operation. The bias voltage 468 takes a value of 0V to a supply voltage AVDD. The SW1 452 may be made of an NMOS transistor with its gate terminal controlled by a first switch control signal 456. The SW2 454 may be made of an n-channel metal-oxide semiconductor (NMOS) transistor or a p-channel metal-oxide semiconductor (PMOS) transistor with a gate terminal controlled by a second switch control signal 458.

Also showed in FIG. 4A, a pixel voltage V_pxl_1 on bitline 408_1 is coupled to a first input 426_1 of the ADC comparator 470_1 of ADC 420_1 through a pixel capacitor 424_1. And a pixel voltage V_pxl_M on bitline 408_M is coupled to a first input 426_M of the ADC comparator 470_M of ADC 420_M through a pixel capacitor 424_M. An auto-zero (AZ) switch 472 is coupled between the first input 426 and an output 478 of the ADC comparator 470 of the plurality of ADC comparators 470. The AZ switch 472 turns ON and OFF for a short duration pT to reset the ADC comparator 470 for a refreshed operation of ADC 420 from its previous operation. All AZ switches 472 of all ADCs 420 are control by the same AZ switch control signal provided by the control circuitry 106.

Figure 4B:
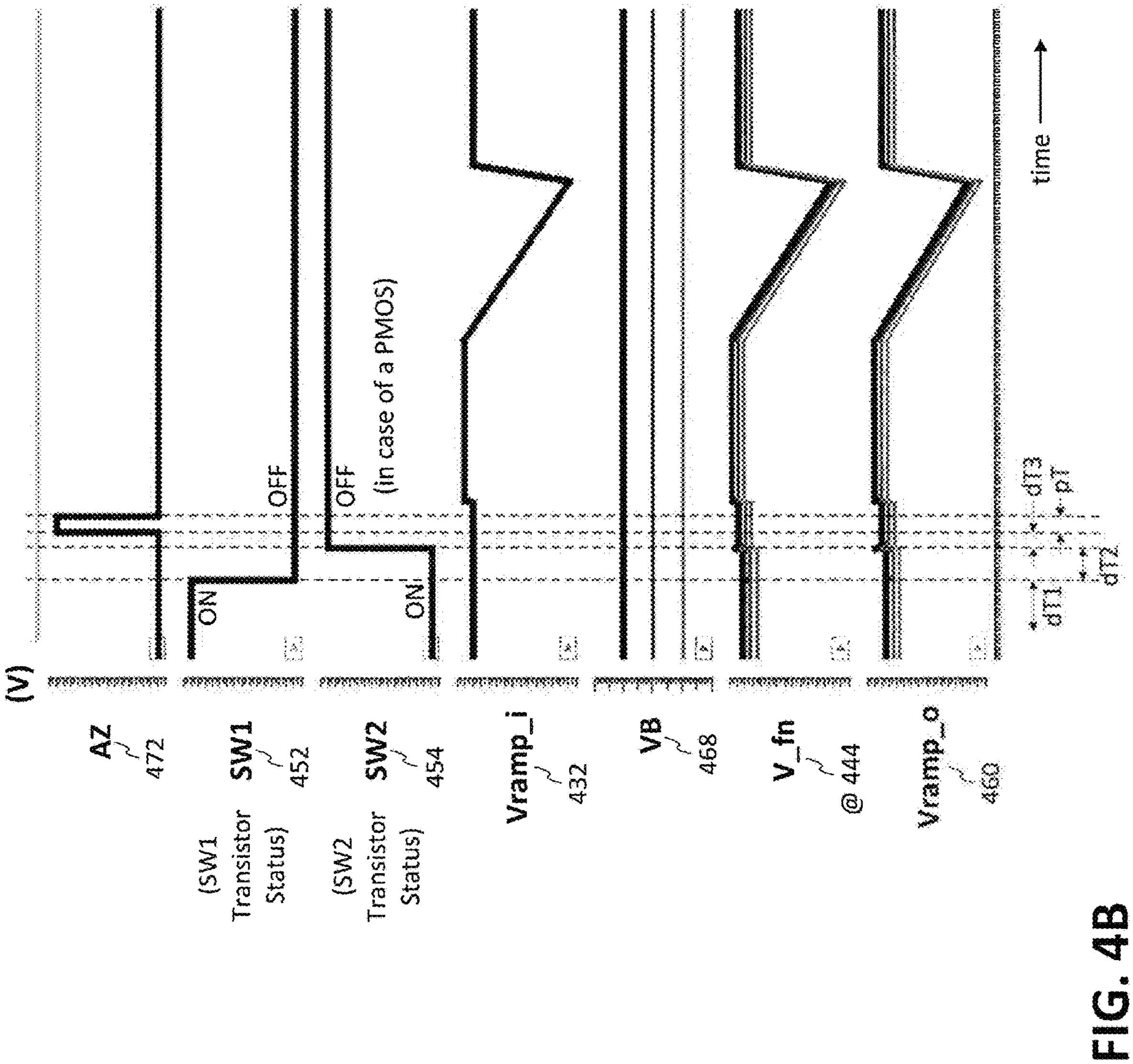
FIG. 4B is a schematic that demonstrates a procedure of presetting the example presettable ramp driver shown in FIG. 4A to prepare the ADCs for their operations in accordance with the teaching of the present disclosure.

FIG. 4B is a schematic that demonstrates a procedure of presetting the example presettable ramp driver 440 shown in FIG. 4A to prepare the M ADCs 420, driven by the driver output 462 at second inputs of the M ADCs 420, for their operations in accordance with the teaching of the present disclosure. In a sequence, a presetting procedure may include the following steps: (a) setting both SW1 452 by the first switch control signal 456 and SW2 454 by the second switch control signal 458 ON for a first time duration dT1, as shown in FIG. 4B, and also setting the bias voltage 468 to an optimized value between 0V and AVDD; (b) flipping the first switch control signal 456 to turn SW1 452 OFF for a second time duration dT2; (c) flipping the second switch control signal 458 to turn SW2 454 OFF for a third time duration dT3; (d) generating a voltage pulse with a width of a fourth time duration pT to turn the auto-zero (AZ) switch 472 ON and OFF to reset the ADC comparator 470 of ADC 420.

As can be seen from FIG. 4B, after dT3, the presettable ramp driver 440 is preset and is ready to drive the ADC 420. And after the AZ reset upon the conclusion of the pT, the ADC 420 is ready to operate normally. As indicated by all the waveform curves, a ramp voltage Vramp_o 460 at the driver output 462 follows a ramp voltage Vramp_i 432 at the driver input 438 very well, as demanded by the design, through the floating node voltage V_fn at the FN 444.

The time durations dT1, dT2, dT3, and pT shown in FIG. 4B are in the range of a few picoseconds to a few microseconds. The first switch control signal 456, the second switch control signal 458, and the bias control voltage 468 are provided by the control circuitry 106.

Figure 4C:
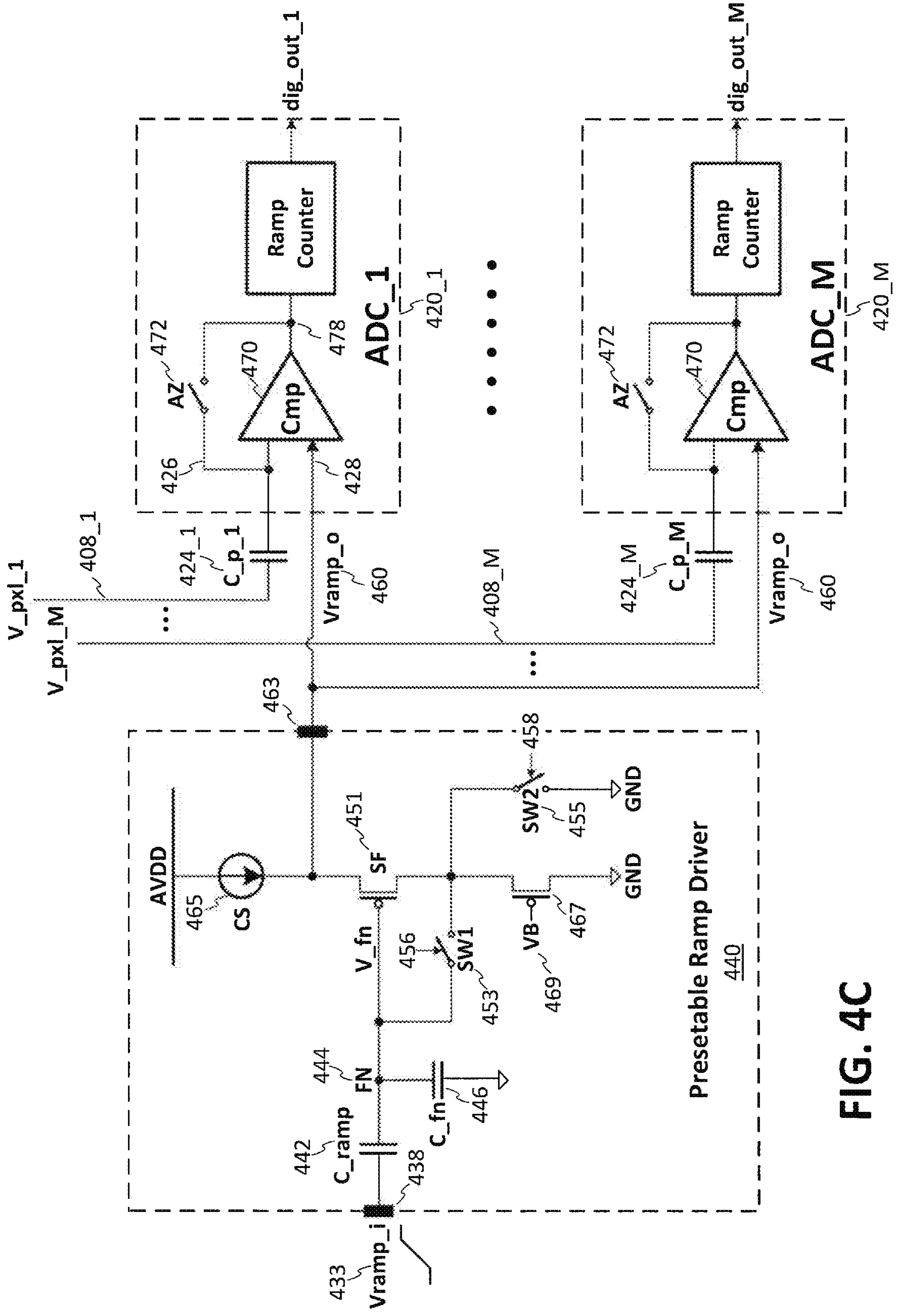
FIG. 4C is a schematic that shows a fourth embodiment of example presettable ramp drivers driving multiple associated ADC comparators in accordance with the teaching of the present disclosure.

FIG. 4C is a schematic that shows a fourth embodiment of an example presettable ramp driver 440 driving at least two associated ADC comparators 470 of ADC_1 420_1 through ADC_M 420_M, where M is an integer equal or larger than 2, in accordance with the teaching of the present disclosure. For each presettable ramp drivers 440, a ramp capacitor 442 is coupled between a driver input 438 of the presettable ramp driver 440 and a floating node (FN) 444. The driver input 438 is driven by a ramping up ramp voltage Vramp_i 433 from the ramp generator 230 (no shown). The FN 444 has an intrinsic capacitance of C_fn 446 and is coupled to a gate of a source follower (SF) transistor 451 made of a p-channel metal-oxide semiconductor (PMOS) transistor. A drain terminal of the SF transistor 451 is coupled to a ground (GND). The source terminal of the SF transistor 450 is coupled to a driver output 463 of the presettable ramp driver 440. A current source 465 is coupled between a power supply AVDD and the driver output 463. The driver output 463 is coupled to a second input 428 of each M ADC comparators 470_1 through 470_M of a plurality ADC comparators 470.

Also for each presettable ramp drivers 440, a first switch (SW1) 453 is coupled between the FN 444 and the drain terminal of the SF transistor 451. A second switch (SW2) 455 is coupled between the drain terminal of the SF transistor 451 and the ground GND. A bias transistor 467 is also coupled between the drain terminal of the SF transistor 451 and the GND. The bias transistor 467 is controlled by a bias voltage 469 for its optimal operation. The bias voltage 469 takes a value between 0V and a supply voltage AVDD. The SW1 453 may be made of an NMOS transistor or a PMOS transistor with its gate terminal controlled by a first switch control signal 456. The SW2 455 may be made of an NMOS transistor or a PMOS transistor with a gate terminal controlled by a second switch control signal 458.

Also showed in FIG. 4C, a pixel voltage V_pxl_1 on bitline 408_1 is coupled to a first input 426_1 of the ADC comparator 470_1 of ADC 420_1 through a pixel capacitor 424_1. And a pixel voltage V_pxl_M on bitline 408_M is coupled to a first input 426_M of the ADC comparator 470_M of ADC 420_M through a pixel capacitor 424_M. An auto-zero (AZ) switch 472 is coupled between the first input 426 and an output 478 of the ADC comparator 470 of the plurality of ADC comparators 470. The AZ switch 472 turns ON and OFF for a short duration pT to reset the ADC comparator 470 for a refreshed operation of ADC 420 from its previous operation. All AZ switches 472 of all ADCs 420 are control by the same AZ switch control signal provided by the control circuitry 106.

Figure 4D:
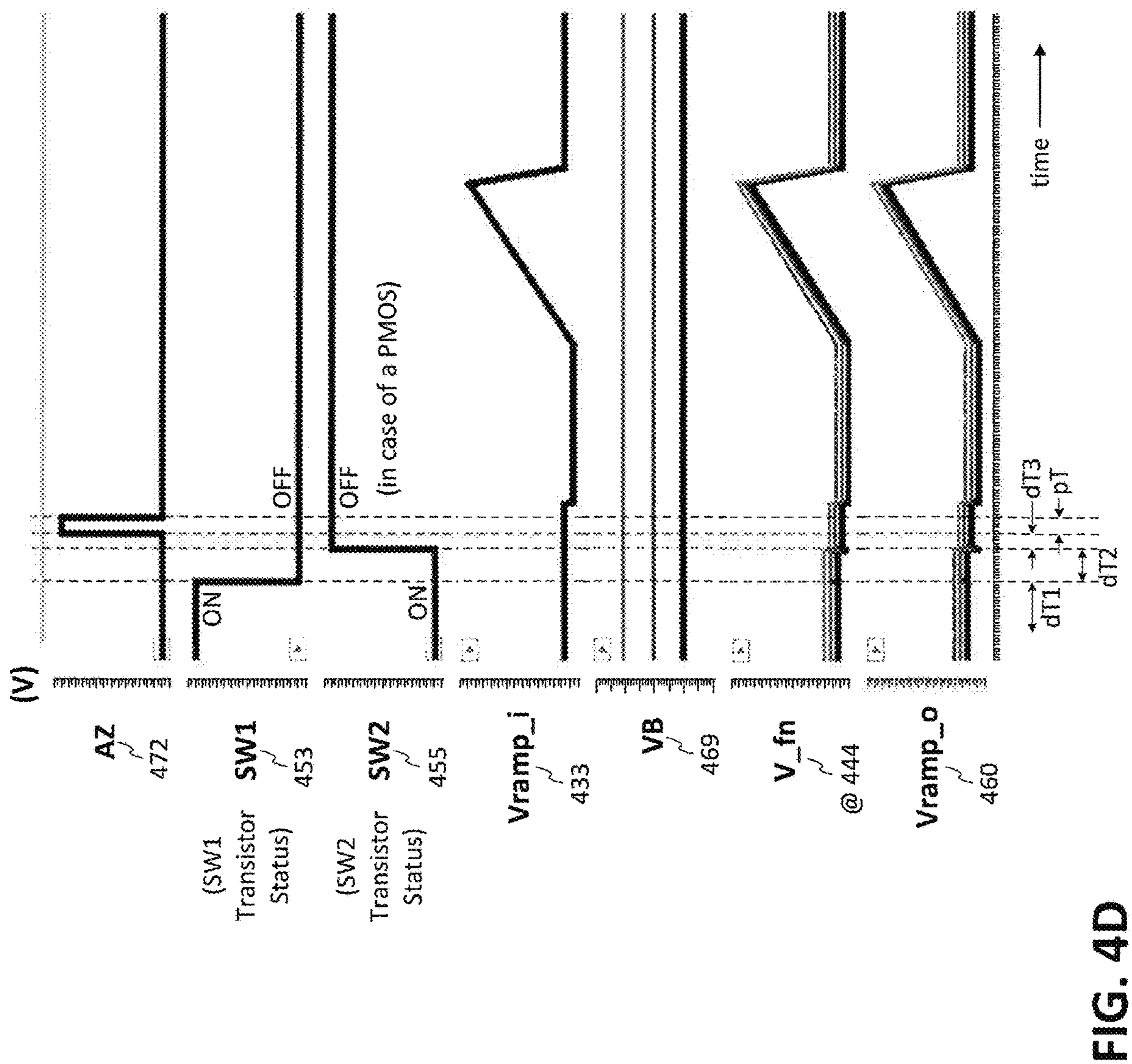
FIG. 4D is a schematic that demonstrates a procedure of presetting the example presettable ramp driver shown in FIG. 4C to prepare the ADCs for their operations in accordance with the teaching of the present disclosure.

FIG. 4D is a schematic that demonstrates a procedure of presetting the example presettable ramp driver 440 shown in FIG. 4C to prepare the M ADCs 420, driven by the driver output 463 at second inputs of the M ADCs 420, for their operations in accordance with the teaching of the present disclosure. In a sequence, a presetting procedure may include the following steps: (a) setting both SW1 453 by the first switch control signal 456 and SW2 455 by the second switch control signal 458 ON for a first time duration dT1, as shown in FIG. 4D, and also setting the bias voltage 469 to an optimized value between 0V and AVDD; (b) flipping the first switch control signal 456 to turn SW1 453 OFF for a second time duration dT2; (c) flipping the second switch control signal 458 to turn SW2 455 OFF for a third time duration dT3; (d) generating a voltage pulse with a width of a fourth time duration pT to turn the auto-zero (AZ) switch 472 ON and OFF to reset the ADC comparator 470 of ADC 420.

As can be seen from FIG. 4D, after dT3, the presettable ramp driver 440 is preset and is ready to drive the ADC 420. And after the AZ reset upon the conclusion of the pT, the ADC 420 is ready to operate normally. As indicated by all the waveform curves, a ramp voltage Vramp_o 460 at the driver output 463 follows a ramp voltage Vramp_i 433 at the driver input 438 very well, as demanded by the design, through the floating node voltage V_fn at the FN 444.

The time durations dT1, dT2, dT3, and pT shown in FIG. 4D are in the range of a few picoseconds to a few microseconds. The first switch control signal 456, the second switch control signal 458, and the bias control voltage 469 are provided by the control circuitry 106.

Figure 5A:
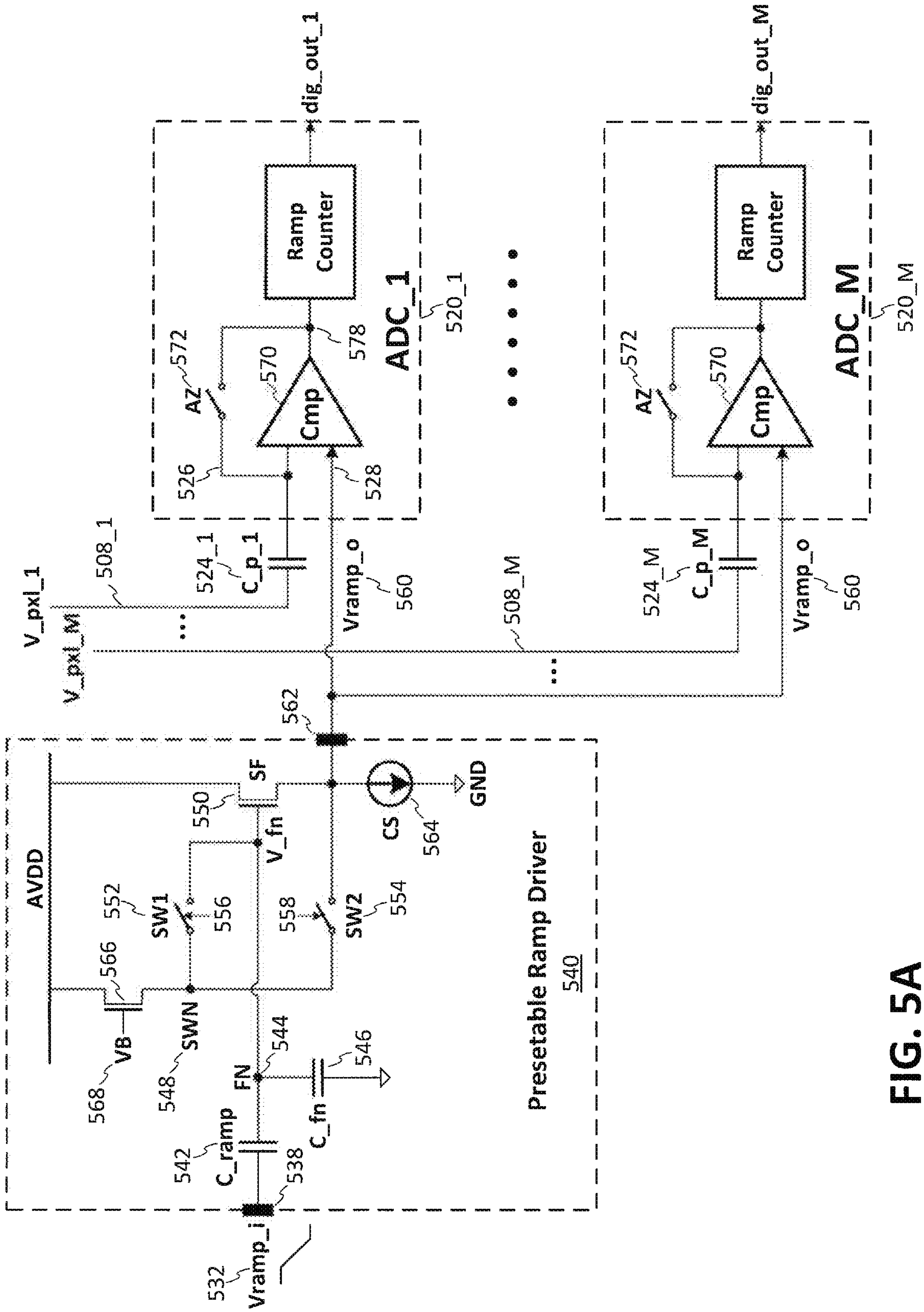
FIG. 5A is a schematic that shows a fifth embodiment of example presettable ramp drivers driving multiple associated ADC comparators in accordance with the teaching of the present disclosure.

FIG. 5A is a schematic that shows a fifth embodiment of an example presettable ramp driver 540 driving at least two associated ADC comparators 570 of ADC_1 520_1 through ADC_M 520_M, where M is an integer equal or larger than 2, in accordance with the teaching of the present disclosure. For each presettable ramp drivers 540, a ramp capacitor 542 is coupled between a driver input 538 of the presettable ramp driver 540 and a floating node (FN) 544. The driver input 538 is driven by a ramp voltage Vramp_i 532 from the ramp generator 230 (no shown). The FN 544 has an intrinsic capacitance of C_fn 546 and is coupled to a gate of a source follower (SF) transistor 550 made of an n-channel metal-oxide semiconductor (NMOS) transistor. A drain terminal of the SF transistor 550 is coupled to a power supply. A source terminal of the SF transistor 550 is coupled to a driver output 562 of the presettable ramp driver 540. A current source 564 is coupled between the driver output 562 and a ground (GND). The driver output 562 is coupled to a second input 528 of each M ADC comparators 570_1 through 570_M of a plurality ADC comparators 570.

Also for each presettable ramp drivers 540, a first switch (SW1) 552 is coupled between a switch node (SWN) 548 and the gate terminal of the SF transistor 550. A second switch (SW2) 554 is coupled between the SWN 548 and the driver output 562. A bias transistor 566 is coupled between the SWN 548 and the power supply. The bias transistor 566 is controlled by a bias voltage 568 for its optimal operation. The bias voltage 568 takes a value of 0V to a supply voltage AVDD. The SW1 552 may be made of an n-channel metal-oxide semiconductor (NMOS) or a p-channel metal-oxide semiconductor (PMOS) transistor with its gate terminal controlled by a first switch control signal 556. The SW2 454 may be made of an NMOS or a PMOS transistor with its gate terminal controlled by a second switch control signal 558.

Also showed in FIG. 5A, a pixel voltage V_pxl_1 on bitline 508_1 is coupled to a first input 526_1 of the ADC comparator 570_1 of ADC 520_1 through a sample capacitor 524_1. And a pixel voltage V_pxl_M on bitline 508_M is coupled to a first input 526_M of the ADC comparator 570_M of ADC 520_M through a sample capacitor 524_M. An auto-zero (AZ) switch 572 is coupled between the first input 526 and an output 578 of the ADC comparator 570 of the plurality of ADC comparators 570. The AZ switch 572 turns ON and OFF for a short duration pT to reset the ADC comparator 570 for a refreshed operation of ADC 520 from its previous operation. All AZ switches 572 of all ADCs 520 are control by the same AZ switch control signal issued by the control circuitry 106.

Figure 5B:
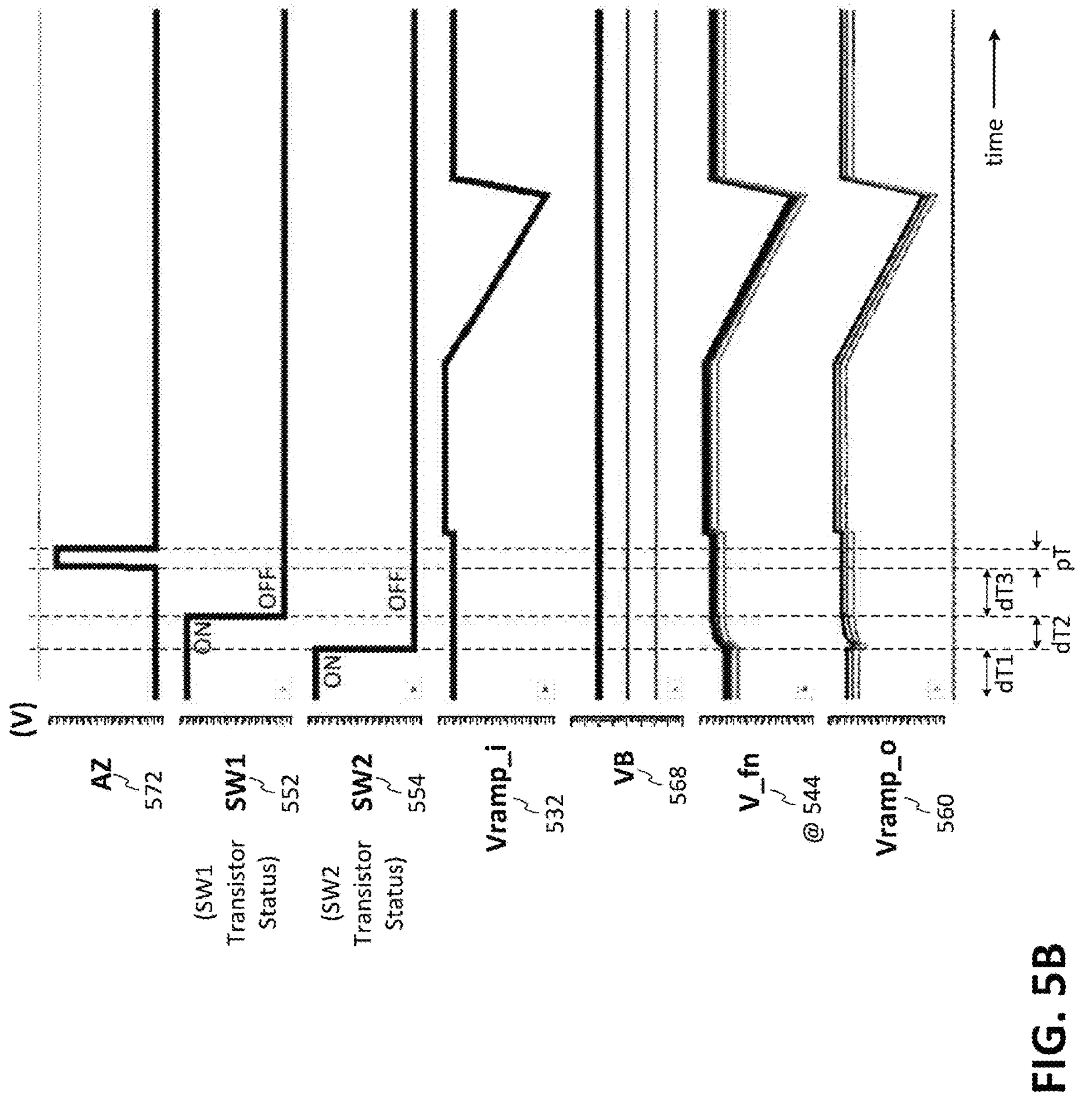
FIG. 5B is a schematic that demonstrates a first procedure of presetting the example presettable ramp driver shown in FIG. 5A to prepare the ADCs for their operations in accordance with the teaching of the present disclosure.

FIG. 5B is a schematic that demonstrates a first procedure of presetting the example presettable ramp driver 540 shown in FIG. 5A to prepare the M ADCs 520, driven by the driver output 562 at second inputs of the M ADCs 520, for their operations in accordance with the teaching of the present disclosure. In a sequence, a first presetting procedure may include the following steps: (a) setting both SW1 552 by the first switch control signal 556 and SW2 454 by the second switch control signal 558 ON for a first time duration dT1, as shown in FIG. 5B, and also setting the bias voltage 568 to an optimized value between 0V and AVDD; (b) flipping the second switch control signal 558 to turn SW2 554 OFF for a second time duration dT2; (c) flipping the first switch control signal 556 to turn SW1 552 OFF for a third time duration dT3; (d) generating a voltage pulse with a width of a fourth time duration pT to turn the AZ switch 572 ON and OFF to reset the ADC comparator 570 of ADC 520.

As can be seen from FIG. 5B, after dT3, the presettable ramp driver 540 is preset and is ready to drive the ADC 520. And after the AZ reset upon the conclusion of the pT, the ADC 520 is ready to operate normally. As indicated by all the waveform curves, a ramp voltage Vramp_o 560 at the driver output 562 follows a ramp voltage Vramp_i 532 at the driver input 538 very well, as demanded by the design, through the floating node voltage V_fn at the FN 544.

The time durations dT1, dT2, dT3, and pT shown in FIG. 5B are in the range of a few picoseconds to a few microseconds. The first switch control signal 556, the second switch control signal 558, and the bias control voltage 568 are provided by the control circuitry 106.

Figure 5C:
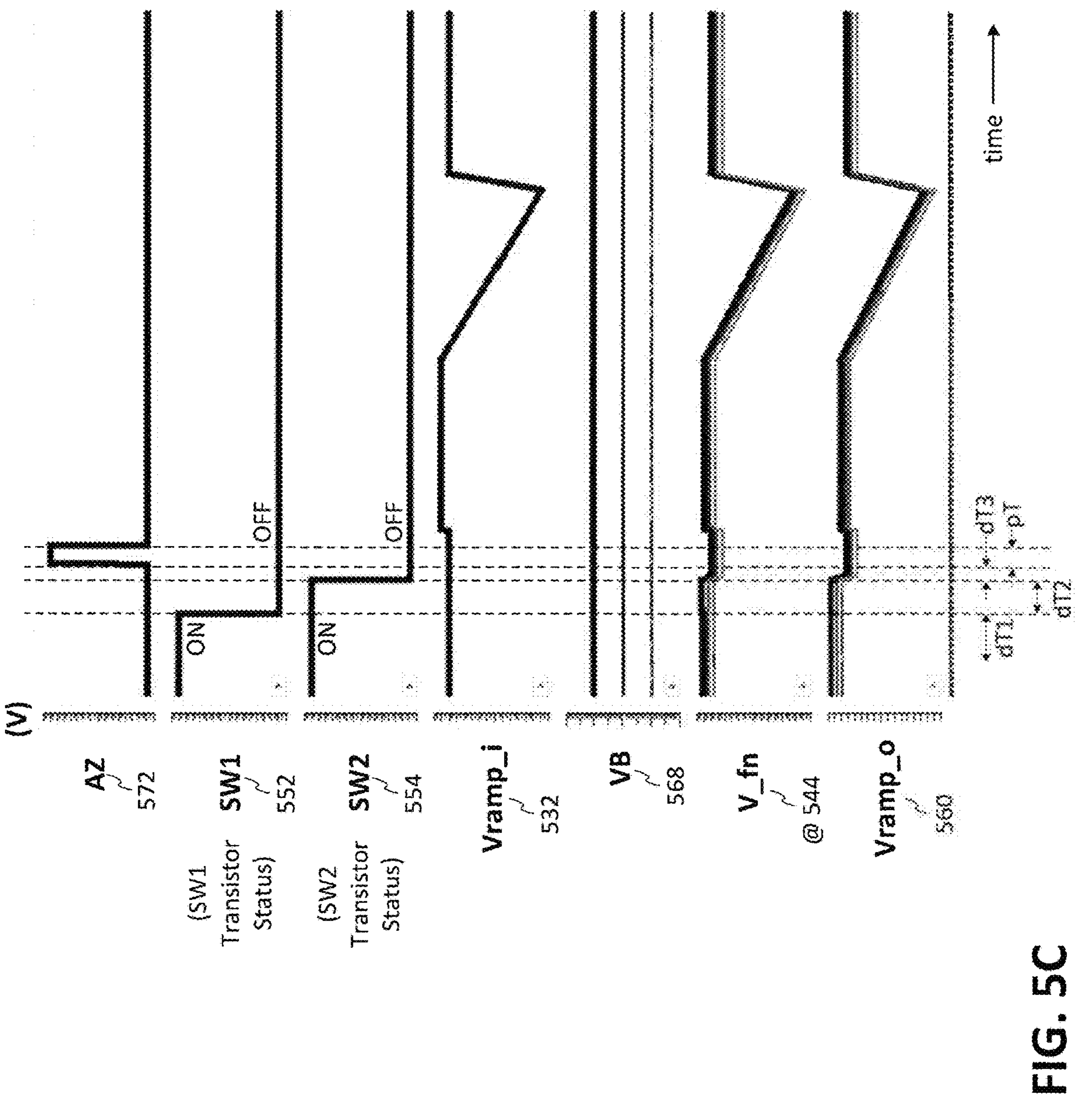
FIG. 5C is a schematic that demonstrates a second procedure of presetting the example presettable ramp driver shown in FIG. 5A to prepare the ADCs for their operations in accordance with the teaching of the present disclosure.

FIG. 5C is a schematic that demonstrates a second procedure of presetting the example presettable ramp driver 540 shown in FIG. 5A to prepare the M ADCs 420, driven by the driver output 562 at second inputs of the M ADCs 520, for their operations in accordance with the teaching of the present disclosure. In a sequence, a second presetting procedure includes the following steps: (a) setting both SW1 552 by the first switch control signal 556 and SW2 554 by the second switch control signal 558 ON for a first time duration dT1, as shown in FIG. 4B, and also setting the bias voltage 568 to an optimized value between 0V and AVDD; (b) flipping the first switch control signal 556 to turn SW1 552 OFF for a second time duration dT2; (c) flipping the second switch control signal 558 to turn SW2 554 OFF for a third time duration dT3; (d) generating a voltage pulse with a width of a fourth time duration pT to turn the AZ switch 572 ON and OFF to reset the ADC comparator 570 of ADC 520.

As can be seen from FIG. 5C, after dT3, the presettable ramp driver 540 is preset and is ready to drive the ADC 520. And after the AZ reset upon the conclusion of the pT, the ADC 520 is ready to operate normally. As indicated by all the curves, a ramp voltage Vramp_o 560 at the driver output 562 follows a ramp voltage Vramp_i 532 at the driver input 538 very well, as demanded by the design, through the floating node voltage V_fn at the FN 544.

The time durations dT1, dT2, dT3, and pT shown in FIG. 5C are in the range of a few picoseconds to a few microseconds. The first switch control signal 556, the second switch control signal 558, and the bias control voltage 568 are provided by the control circuitry 106.

Figure 5D:
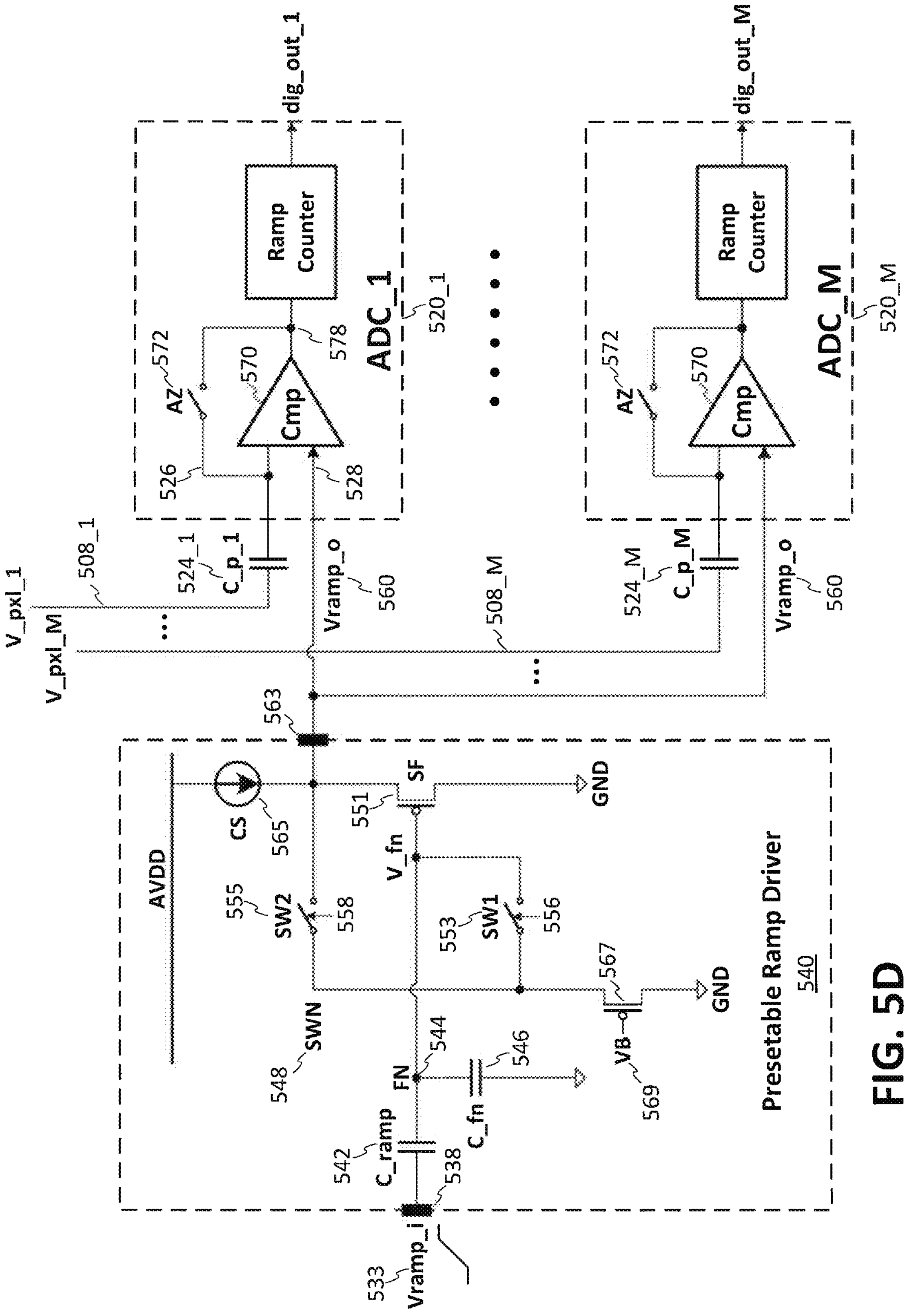
FIG. 5D is a schematic that shows a sixth embodiment of example presettable ramp drivers driving multiple associated ADC comparators in accordance with the teaching of the present disclosure.

FIG. 5D is a schematic that shows a sixth embodiment of an example presettable ramp driver 540 driving at least two associated ADC comparators 570 of ADC_1 520_1 through ADC_M 520_M, where M is an integer equal or larger than 2, in accordance with the teaching of the present disclosure. For each presettable ramp drivers 540, a ramp capacitor 542 is coupled between a driver input 538 of the presettable ramp driver 540 and a floating node (FN) 544. The driver input 538 is driven by a ramping down ramp voltage Vramp_i 532 from the ramp generator 230 (no shown). The FN 544 has an intrinsic capacitance of C_fn 546 and is coupled to a gate of a source follower (SF) transistor 551 made of a p-channel metal-oxide semiconductor (PMOS) transistor. A drain terminal of the SF transistor 551 is coupled to ground (GND). A source terminal of the SF transistor 551 is coupled to a driver output 563 of the presettable ramp driver 540. A current source 565 is coupled between the AVDD and the driver output 563. The driver output 563 is coupled to a second input 528 of each M ADC comparators 570_1 through 570_M of a plurality ADC comparators 570.

Also for each presettable ramp drivers 540, a first switch (SW1) 553 is coupled between a switch node (SWN) 549 and the gate terminal of the SF transistor 551. A second switch (SW2) 555 is coupled between the SWN 549 and the driver output 563. A bias transistor 567 is coupled between the SWN 548 and ground GND. The bias transistor 567 is controlled by a bias voltage 569 for its optimal operation. The bias voltage 569 takes a value of 0V to a supply voltage AVDD. The SW1 553 may be made of an NMOS transistor or a PMOS transistor with its gate terminal controlled by a first switch control signal 556. The SW2 455 may be made of an NMOS or a PMOS transistor with its gate terminal controlled by a second switch control signal 558.

Also showed in FIG. 5D, a pixel voltage V_pxl_1 on bitline 508_1 is coupled to a first input 526_1 of the ADC comparator 570_1 of ADC 520_1 through a sample capacitor 524_1. And a pixel voltage V_pxl_M on bitline 508_M is coupled to a first input 526_M of the ADC comparator 570_M of ADC 520_M through a sample capacitor 524_M. An auto-zero (AZ) switch 572 is coupled between the first input 526 and an output 578 of the ADC comparator 570 of the plurality of ADC comparators 570. The AZ switch 572 turns ON and OFF for a short duration pT to reset the ADC comparator 570 for a refreshed operation of ADC 520 from its previous operation. All AZ switches 572 of all ADCs 520 are control by the same AZ switch control signal issued by the control circuitry 106.

Figure 5E:
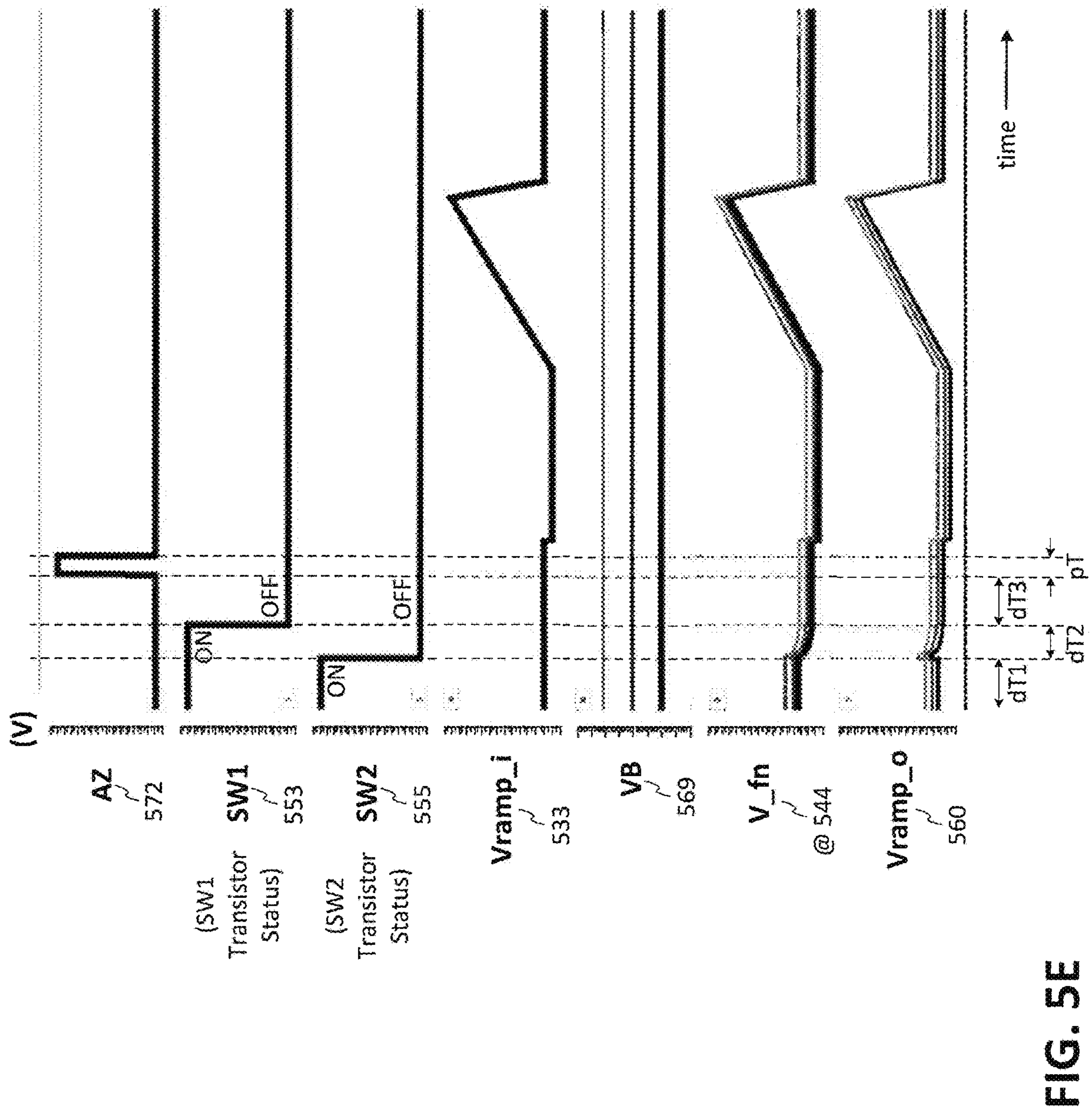
FIG. 5E is a schematic that demonstrates a first procedure of presetting the example presettable ramp driver shown in FIG. 5D to prepare the ADCs for their operations in accordance with the teaching of the present disclosure.

FIG. 5E is a schematic that demonstrates a first procedure of presetting the example presettable ramp driver 540 shown in FIG. 5D to prepare the M ADCs 520, driven by the driver output 562 at second inputs of the M ADCs 520, for their operations in accordance with the teaching of the present disclosure. In a sequence, a first presetting procedure may include the following steps: (a) setting both SW1 553 by the first switch control signal 556 and SW2 455 by the second switch control signal 558 ON for a first time duration dT1, as shown in FIG. 5E, and also setting the bias voltage 569 to an optimized value between 0V and AVDD; (b) flipping the second switch control signal 558 to turn SW2 555 OFF for a second time duration dT2; (c) flipping the first switch control signal 556 to turn SW1 553 OFF for a third time duration dT3; (d) generating a voltage pulse with a width of a fourth time duration pT to turn the AZ switch 572 ON and OFF to reset the ADC comparator 570 of ADC 520.

As can be seen from FIG. 5E, after dT3, the presettable ramp driver 540 is preset and is ready to drive the ADC 520. And after the AZ reset upon the conclusion of the pT, the ADC 520 is ready to operate normally. As indicated by all the curves, a ramp voltage Vramp_o 560 at the driver output 563 follows a ramping up ramp voltage Vramp_i 533 at the driver input 538 very well, as demanded by the design, through the floating node voltage V_fn at the FN 544.

The time durations dT1, dT2, dT3, and pT shown in FIG. 5E are in the range of a few picoseconds to a few microseconds. The first switch control signal 556, the second switch control signal 558, and the bias control voltage 569 are provided by the control circuitry 106.

Figure 5F:
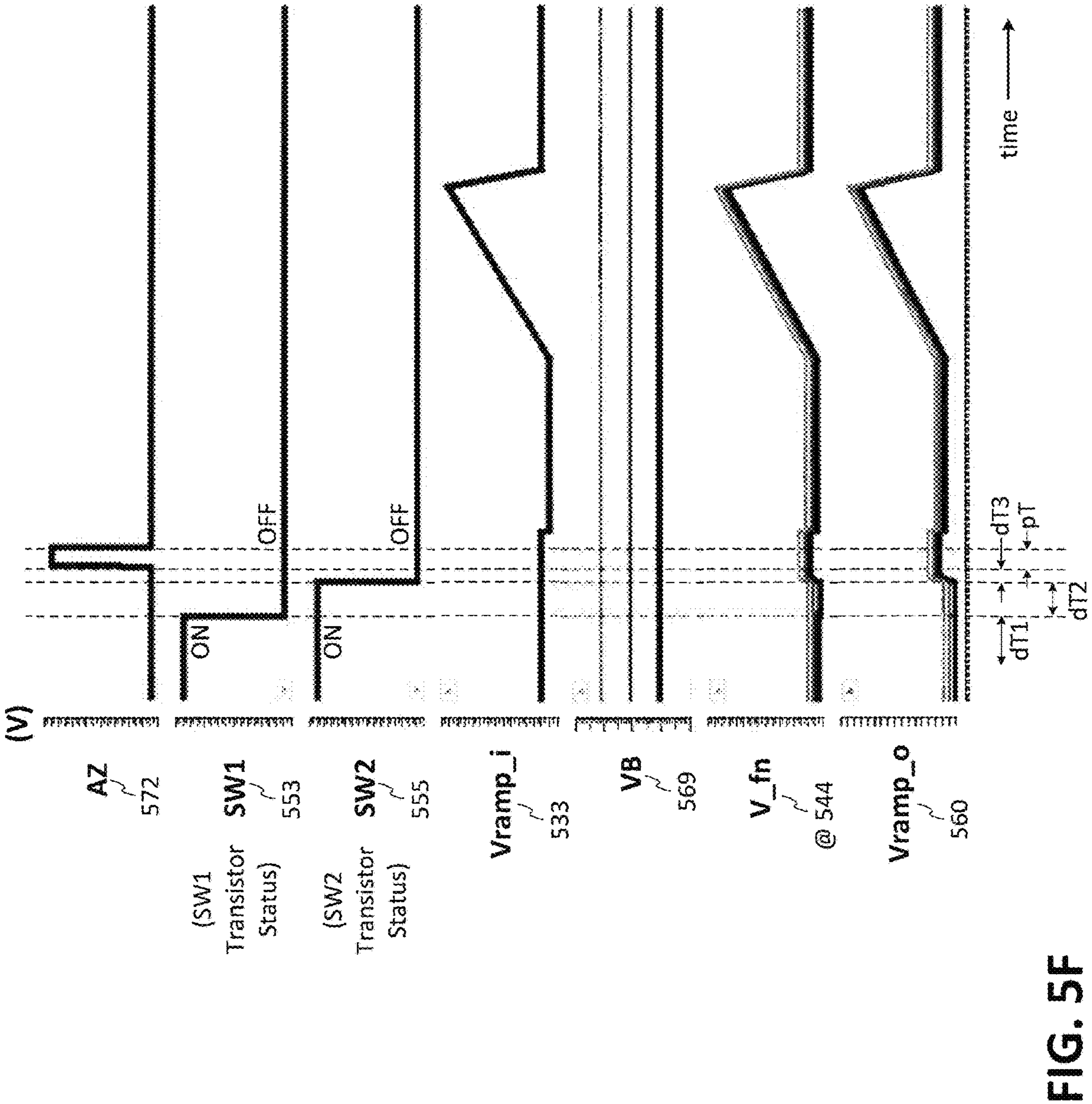
FIG. 5F is a schematic that demonstrates a second procedure of presetting the example presettable ramp driver shown in FIG. 5D to prepare the ADCs for their operations in accordance with the teaching of the present disclosure.

FIG. 5F is a schematic that demonstrates a second procedure of presetting the example presettable ramp driver 540 shown in FIG. 5A to prepare the M ADCs 420, driven by the driver output 563 at second inputs of the M ADCs 520, for their operations in accordance with the teaching of the present disclosure. In a sequence, a second presetting procedure includes the following steps: (a) setting both SW1 553 by the first switch control signal 556 and SW2 555 by the second switch control signal 558 ON for a first time duration dT1, as shown in FIG. 4E, and also setting the bias voltage 569 to an optimized value between 0V and AVDD; (b) flipping the first switch control signal 556 to turn SW1 553 OFF for a second time duration dT2; (c) flipping the second switch control signal 558 to turn SW2 555 OFF for a third time duration dT3; (d) generating a voltage pulse with a width of a fourth time duration pT to turn the AZ switch 572 ON and OFF to reset the ADC comparator 570 of ADC 520.

As can be seen from FIG. 5F, after dT3, the presettable ramp driver 540 is preset and is ready to drive the ADC 520. And after the AZ reset upon the conclusion of the pT, the ADC 520 is ready to operate normally. As indicated by all the curves, a ramp voltage Vramp_o 560 at the driver output 562 follows a ramping up ramp voltage Vramp_i 533 at the driver input 538 very well, as demanded by the design, through the floating node voltage V_fn at the FN 544.

The time durations dT1, dT2, dT3, and pT shown in FIG. 5F are in the range of a few picoseconds to a few microseconds. The first switch control signal 556, the second switch control signal 558, and the bias control voltage 569 are provided by the control circuitry 106.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A readout analog-to-digital converter (ADC) circuitry, comprising:

a plurality of bitlines;

a plurality of ADCs;

a plurality of ADC comparators, wherein each ADC comparator is associated with an ADC of the plurality of ADCs;

a plurality of sample capacitors, wherein each sample capacitor is coupled between a bitline of the plurality of bitlines and a first input of an ADC comparator of the plurality of ADC comparators;

a ramp generator;

a plurality of presettable ramp drivers, wherein each presettable ramp driver is coupled between the ramp generator and at least two second inputs of ADC comparators, wherein each presettable ramp driver of the plurality of presettable ramp drivers comprises a driver input, a ramp capacitor, a floating node, a source follower transistor, a current source, and a driver output, wherein the driver input is coupled to the ramp generator, the ramp capacitor is coupled between to the driver input and the floating node, the floating node has an intrinsic capacitance, a gate terminal of the source follower transistor is coupled to the floating node, a source terminal of the source follower transistor is coupled to the driver output, the current source is coupled to the driver output, and the driver output is coupled to a second input of an ADC comparator of the plurality of ADC comparators, wherein each presettable ramp driver of the plurality of presettable ramp drivers further comprises a first switch, a second switch, a first switch control signal, and a second switch control signal, wherein the first switch is coupled between the floating node and a drain terminal of the source follower transistor, the second switch is coupled between the floating node and the source terminal of the source follower transistor, and wherein the first switch is one of an NMOS transistor and a PMOS transistor with a gate terminal connected to the first switch control signal and the second switch is one of an NMOS transistor and a PMOS transistor with a gate terminal connected to the second switch control signal; and a plurality of ramp counters, wherein each ramp counter is coupled to an output of the ADC comparator of the plurality of the ADCs to latch and provide digital image data of an ADC associated with the ADC comparator when the output of the ADC comparator flips its value.

2. The readout ADC circuitry of claim 1, further comprises a plurality of auto-zero (AZ) switches, wherein each AZ switch is coupled between the first input and the output of the ADC comparator of the plurality of the ADC comparators.

3. The readout ADC circuitry of claim 1, wherein the source follower transistor is an NMOS transistor, the drain terminal of the source follower transistor is coupled to a power supply, and the current source is coupled between the driver output and ground.

4. The readout ADC circuitry of claim 1, wherein the source follower transistor is a PMOS transistor, the drain terminal of the source follower transistor is coupled to ground, and the current source is coupled between the driver output and a power supply.

5. The readout ADC circuitry of claim 1, wherein each presettable ramp driver of the plurality of presettable ramp drivers further comprises a first switch, a second switch, a first switch control signal, and a second switch control signal, wherein the first switch is coupled between the floating node and a drain terminal of the source follower transistor, a second switch is coupled to the drain terminal of the source follower transistor, and wherein the first switch is one of an NMOS transistor and a PMOS transistor with a gate terminal connected to the first switch control signal and the second switch is one of an NMOS transistor and a PMOS with a gate terminal connected to the second switch control signal.

6. The readout ADC circuitry of claim 5, wherein each presettable ramp driver of the plurality of presettable ramp drivers further comprises a bias transistor and a bias control signal, wherein both the bias transistor and the source follower transistor are NMOS transistors, the bias transistor is coupled between the drain terminal of the source follower transistor and a power supply, and a gate terminal of the bias transistor is connected to the bias control signal, the second switch is coupled between the drain terminal of the source follower transistor and the power supply, and the current source is coupled between the driver output and ground.

7. The readout ADC circuitry of claim 5, wherein each presettable ramp driver of the plurality of presettable ramp drivers further comprises a bias transistor and a bias control signal, wherein both the bias transistor and the source follower transistor are PMOS transistors, the bias transistor is coupled between the drain terminal of the source follower transistor and ground, and a gate terminal of the bias transistor is connected to the bias control signal, the second switch is coupled between the drain terminal of the source follower transistor and ground, and the current source is coupled between the driver output and a power supply.

8. The readout ADC circuitry of claim 1, wherein each presettable ramp driver of the plurality of presettable ramp drivers further comprises a switch node, a first switch, a second switch, a first switch control signal, and a second switch control signal, wherein the first switch is coupled between the switch node and the floating node, the second switch is coupled between the switch node and the driver output, and wherein the first switch is one of an NMOS transistor and a PMOS transistor with a gate terminal connected to the first switch control signal and the second switch is one of an NMOS transistor and a PMOS transistor with a gate terminal connected to the second switch control signal.

9. The readout ADC circuitry of claim 8, wherein each presettable ramp driver of the plurality of presettable ramp drivers further comprises a bias transistor and a bias control signal, wherein both the bias transistor and the source follower transistor are NMOS transistors, the bias transistor is coupled between the switch node and a power supply, a gate terminal of the bias transistor is connected to the bias control signal, and the current source is coupled between the driver output and ground.

10. The readout ADC circuitry of claim 8, wherein each presettable ramp driver of the plurality of presettable ramp drivers further comprises a bias transistor and a bias control signal, wherein both the bias transistor and the source follower transistor are PMOS transistors, the bias transistor is coupled between and the switch node and ground, a gate terminal of the bias transistor is connected to the bias control signal, and the current source is coupled between the driver output and a power supply.

11. A method of presetting a presettable ramp driver to prepare for an analog-to-digital converter (ADC) operation, comprising:

setting a first switch control signal to a first switch voltage to turn a first switch on, and setting a second switch control signal to a second switch voltage to turn a second switch on, wherein the first switch and the second switch are configured within the presettable ramp driver;

after a first time duration, flipping the second switch control signal to an inverted voltage of the second switch voltage to turn the second switch off;

after a second time duration, flipping the first switch control signal to an inverted voltage of the first switch voltage to turn the first switch off;

after a third time duration, generating an auto-zero (AZ) voltage pulse to turn an AZ switch of an ADC comparator on, and after a fourth time duration to turn the AZ switch of the ADC comparator off, to reset the ADC; and receiving a pixel signal from a bitline to couple to a first input of an ADC comparator, and receiving a ramp signal from a ramp generator to couple through the presettable ramp driver into a second input of the ADC comparator.

12. The method of presetting a presettable ramp driver to prepare for an ADC operation of claim 11, wherein the first switch control signal, the second switch control signal, and the AZ voltage pulse are controlled by a control circuitry, and wherein the first, second, third, and fourth time durations are in the range of a few nanoseconds to a few microseconds.

13. A method of presetting a presettable ramp driver to prepare for an analog-to-digital converter (ADC) operation, comprising:

setting a bias voltage to a bias value that is between OV and a supply voltage AVDD to bias a bias transistor for its optimal operation, setting a first switch control signal to a first switch voltage to turn a first switch on, and setting a second switch control signal to a second switch voltage to turn a second switch on, wherein the first switch and the second switch are configured within the presettable ramp driver;

after a first time duration, flipping the first switch control signal to an inverted voltage of the first switch voltage to turn the first switch off;

after a second time duration, flipping the second switch control signal to an inverted voltage of the second switch voltage, to turn the second switch off;

after a third time duration, generating an auto-zero (AZ) voltage pulse to turn an AZ switch of an ADC comparator on, and after a fourth time duration to turn the AZ switch of the ADC comparator off, to reset the ADC; and receiving a pixel signal from a bitline to couple to a first input of an ADC comparator, and receiving a ramp signal from a ramp generator to couple through the presettable ramp driver into a second input of the ADC comparator.

14. The method of presetting a presettable ramp driver to prepare for an ADC operation of claim 13, wherein the first switch control signal, the second switch control signal, and the AZ voltage pulse are controlled by a control circuitry, and wherein the first, second, third, and fourth time durations are in the range of a few nanoseconds to a few microseconds.

15. A method of presetting a presettable ramp driver to prepare for an analog-to-digital converter (ADC) operation, comprising:

setting a bias voltage to a bias value that is between OV and a supply voltage AVDD to bias a bias transistor for its optimal operation, setting a first switch control signal to a first switch voltage to turn a first switch on, and setting a second switch control signal to a second switch voltage to turn a second switch on, wherein the first switch and the second switch are configured within the presettable ramp driver;

after a first time duration, flipping the second switch control signal to an inverted voltage of the second switch voltage to turn the second switch off;

after a second time duration, flipping the first switch control signal to an inverted voltage of the first switch voltage, to turn the first switch off;

after a third time duration, generating an auto-zero (AZ) voltage pulse to turn an AZ switch of an ADC comparator on, and after a fourth time duration to turn the AZ switch of the ADC comparator off, to reset the ADC; and receiving a pixel signal from a bitline to couple to a first input of an ADC comparator, and receiving a ramp signal from a ramp generator to couple through the presettable ramp driver into a second input of the ADC comparator.

16. The method of presetting a presettable ramp driver to prepare for an ADC operation of claim 15, wherein the first switch control signal, the second switch control signal, and the AZ voltage pulse are controlled by a control circuitry, and wherein the first, second, third, and fourth time durations are in the range of a few nanoseconds to a few microseconds.

17. A readout analog-to-digital converter (ADC) image sensing system, comprising:

a pixel array;

a control circuitry coupled to the pixel array to control operation of the pixel array;

a readout circuitry controlled by the control circuitry and coupled to the pixel array through a bitline to read out analog image data from the pixel array, wherein the readout circuitry comprises a readout ADC to convert analog image data to digital image data, wherein the readout ADC comprises:

a plurality of bitlines;

a plurality of ADCs;

a plurality of ADC comparators, wherein each ADC comparator is associated with an ADC of the plurality of ADCs;

a plurality of sample capacitors, wherein each sample capacitor is coupled between a bitline of the plurality of bitlines and a first input of an ADC comparator of the plurality of ADC comparators;

a ramp generator;

a plurality of presettable ramp drivers, wherein each presettable ramp driver is coupled between the ramp generator and at least two second inputs of ADC comparators, wherein each presettable ramp driver of the plurality of presettable ramp drivers comprises a driver input, a ramp capacitor, a floating node, a source follower transistor, a current source, and a driver output, wherein the driver input is coupled to the ramp generator, the ramp capacitor is coupled between to the driver input and the floating node, the floating node has an intrinsic capacitance, a gate terminal of the source follower transistor is coupled to the floating node, a source terminal of the source follower transistor is coupled to the driver output, the current source is coupled to the driver output, and the driver output is coupled to a second input of an ADC comparator of the plurality of ADC comparators, wherein each presettable ramp driver of the plurality of presettable ramp drivers further comprises a first switch, a second switch, a first switch control signal, and a second switch control signal, wherein the first switch is coupled between the floating node and a drain terminal of the source follower transistor, the second switch is coupled between the floating node and the source terminal of the source follower transistor, and wherein the first switch is one of an NMOS transistor and a PMOS transistor with a gate terminal connected to the first switch control signal and the second switch is one of an NMOS transistor and a PMOS transistor with a gate terminal connected to the second switch control signal; and a plurality of ramp counters, wherein each ramp counter is coupled to an output of the ADC comparator of the plurality of the ADCs to latch and provide digital image data of an ADC associated with the ADC comparator when the output of the ADC comparator flips its value; and a function logic coupled to the readout circuitry to receive digital image data.

18. The readout ADC image sensing system of claim 17, further comprises a plurality of auto-zero (AZ) switches, wherein each AZ switch is coupled between the first input and the output of the ADC comparator of the plurality of the ADC comparators.

19. The readout ADC image sensing system of claim 17, wherein the source follower transistor is an NMOS transistor, the drain terminal of the source follower transistor is coupled to a power supply, and the current source is coupled between the driver output and ground.

20. The readout ADC image sensing system of claim 17, wherein the source follower transistor is a PMOS transistor, the drain terminal of the source follower transistor is coupled to ground, and the current source is coupled between the driver output and a power supply.

21. The readout ADC image sensing system of claim 17, wherein each presettable ramp driver of the plurality of presettable ramp drivers further comprises a first switch, a second switch, a first switch control signal, and a second switch control signal, wherein the first switch is coupled between the floating node and a drain terminal of the source follower transistor, a second switch is coupled to the drain terminal of the source follower transistor, and wherein the first switch is one of an NMOS transistor and a PMOS transistor with a gate terminal connected to the first switch control signal and the second switch is one of an NMOS transistor and a PMOS with a gate terminal connected to the second switch control signal.

22. The readout ADC image sensing system of claim 21, wherein each presettable ramp driver of the plurality of presettable ramp drivers further comprises a bias transistor and a bias control signal, wherein both the bias transistor and the source follower transistor are NMOS transistors, the bias transistor is coupled between the drain terminal of the source follower transistor and a power supply, and a gate terminal of the bias transistor is connected to the bias control signal, the second switch is coupled between the drain terminal of the source follower transistor and the power supply, and the current source is coupled between the driver output and ground.

23. The readout ADC image sensing system of claim 21, wherein each presettable ramp driver of the plurality of presettable ramp drivers further comprises a bias transistor and a bias control signal, wherein both the bias transistor and the source follower transistor are PMOS transistors, the bias transistor is coupled between the drain terminal of the source follower transistor and ground, and a gate terminal of the bias transistor is connected to the bias control signal, the second switch is coupled between the drain terminal of the source follower transistor and ground, and the current source is coupled between the driver output and a power supply.

24. The readout ADC image sensing system of claim 17, wherein each presettable ramp driver of the plurality of presettable ramp drivers further comprises a switch node, a first switch, a second switch, a first switch control signal, and a second switch control signal, wherein the first switch is coupled between the switch node and the floating node, the second switch is coupled between the switch node and the driver output, and wherein the first switch is one of an NMOS transistor and a PMOS transistor with a gate terminal connected to the first switch control signal and the second switch is one of an NMOS transistor and a PMOS transistor with a gate terminal connected to the second switch control signal.

25. The readout ADC image sensing system of claim 24, wherein each presettable ramp driver of the plurality of presettable ramp drivers further comprises a bias transistor and a bias control signal, wherein both the bias transistor and the source follower transistor are NMOS transistors, the bias transistor is coupled between the switch node and a power supply, a gate terminal of the bias transistor is connected to the bias control signal, and the current source is coupled between the driver output and ground.

26. The readout ADC image sensing system of claim 24, wherein each presettable ramp driver of the plurality of presettable ramp drivers further comprises a bias transistor and a bias control signal, wherein both the bias transistor and the source follower transistor are PMOS transistors, the bias transistor is coupled between and the switch node and ground, a gate terminal of the bias transistor is connected to the bias control signal, and the current source is coupled between the driver output and a power supply.

* * * * *